(12) United States Patent
Shimamura et al.

(10) Patent No.: US 7,111,390 B2
(45) Date of Patent: Sep. 26, 2006

(54) PARTS MOUNTING AND ASSEMBLING APPARATUS

(75) Inventors: Koichi Shimamura, Kawasaki (JP); Kazuhisa Mishima, Kawasaki (JP); Toshiaki Otsuka, Kawasaki (JP); Toru Okada, Kawasaki (JP); Masanao Fujii, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 251 days.

(21) Appl. No.: 10/804,040

(22) Filed: Mar. 19, 2004

(65) Prior Publication Data

US 2005/0034960 A1    Feb. 17, 2005

(30) Foreign Application Priority Data

Aug. 14, 2003   (JP) .............................. 2003-293386

(51) Int. Cl.
*B23P 19/00* (2006.01)
(52) U.S. Cl. .............................. 29/791; 29/700; 29/739; 29/795
(58) Field of Classification Search .................. 29/791, 29/792, 795, 799, 739, 700; 198/346.1
See application file for complete search history.

(56) References Cited

U.S. PATENT DOCUMENTS

| 3,837,063 | A | * | 9/1974 | Wright ............................ 227/2 |
| 3,840,962 | A | * | 10/1974 | Coller .......................... 29/56.6 |
| 3,932,931 | A | * | 1/1976 | Wright .......................... 29/842 |
| 4,099,324 | A | * | 7/1978 | Johnson et al. ................ 29/739 |
| 4,476,627 | A | * | 10/1984 | Matsuura et al. .............. 29/791 |
| 5,295,778 | A | * | 3/1994 | Hirai et al. .................... 29/739 |
| 5,456,001 | A | * | 10/1995 | Mori et al. .................... 29/739 |
| 5,509,191 | A | * | 4/1996 | Best .............................. 29/722 |
| 5,515,599 | A | * | 5/1996 | Best .............................. 29/705 |
| 5,768,768 | A | * | 6/1998 | Best .............................. 29/792 |
| 6,086,641 | A | * | 7/2000 | Shironouchi ............... 29/25.01 |
| 6,409,642 | B1 | * | 6/2002 | Tominaga et al. ............ 483/16 |
| 6,691,405 | B1 | * | 2/2004 | Kagei ............................ 29/832 |
| 2003/0208903 | A1 | * | 11/2003 | Morbitzer et al. ............ 29/791 |
| 2005/0198804 | A1 | * | 9/2005 | Koren .......................... 29/430 |

FOREIGN PATENT DOCUMENTS

| JP | 57-145334 | 9/1982 |
| JP | 10-308404 | 11/1998 |
| JP | 2005064287 A * | 3/2005 |

* cited by examiner

*Primary Examiner*—Essama Omgba
(74) *Attorney, Agent, or Firm*—Westerman, Hattori, Daniels & Adrian, LLP.

(57) ABSTRACT

An apparatus combining a high-speed high-precision characteristic equivalent to that of a die bonder and a flexibility of coping quickly with a process variation and product variation along with size reduction and economics. This apparatus comprises a base unit including a body containing a device to be used in common among a plurality of processes for mounting and assembling parts, a mechanism for conveying a workpiece in a predetermined conveying direction and a mechanism for positioning the workpiece, a dedicated unit including an end effector, and a selected mechanism unit including a mechanism for moving the end effector in two axial directions perpendicular to the predetermined conveying direction to adjust a relative position between the end effector and the workpiece or a part. The moving mechanism is interchangeably attached on the base unit, and the end effector is interchangeably attached on the moving mechanism.

19 Claims, 21 Drawing Sheets

PARTS MOUNTING AND ASSEMBLING APPARATUS

BACKGROUND OF THE INVENTION

1) Field of the Invention

The present invention relates to a parts mounting and assembling apparatus for use in integrated (full-scale) manufacturing of small-sized parts including micro sensor devices, such as MEMS (Micro Electro Mechanical System) gyro sensors.

2) Description of the Related Art

In general, for the integrated manufacturing of small-sized parts including micro sensor devices, such as MEMS (Micro Electro Mechanical System) gyro sensors, there is a need to realize, in addition to a high-precision machining technique and a mounting technique, a fine low-vibration handling technique between processes in a limited space and at a high order.

In the recent years, along with the progression of modularizing and size-reduction of facilities, in addition to the attempts to achieve the space and energy reduction and short-term startup, there has been a requirement to develop a high-precision and small-sized mounting and assembling apparatus applicable in common to study/experiment to quantity production factories.

Moreover, on the study/experiment level, there is a need to flexibly cope with a change of mounting and assembling process stemming from a frequent element change while on the quantity production level there is a requirement for high throughput and high extensibility. Still moreover, the size and cost reduction are required on either level.

So far, in general, for the mounting/assembling of sensor devices, a die bonder system has been put to use, for example, as disclosed in Japanese Patent Laid-Open Nos. SHO 57-145334 and HEI 10-308404. This die bonder system is suitable for the mass production, for that it achieves the fast high-precision mounting/assembling. On the other hand, it is unsuitable for the large item small volume production because of requiring a high initial investment and a long time length for startup before stable operation. Moreover, a current small-sized modularized facility line considering the large item small volume production cannot satisfy the speed and accuracy requirements (high speed and high accuracy) required in a field of sensor devices.

The problems of the current large item small volume production system are the following (1) to (3).

(1) So far, a product development department manufactures trial models once or twice for quantity production. The facility for the production of the trial models uses a simple jig principally operated in a manual fashion, and the manufacturing condition or the like depends upon this jig. At the quantity production, there is a need to further determine a manufacturing condition suitable for the quantity production facility, which requires much time for the startup for the quantity production of products. Therefore, there is a requirement to develop a parts mounting apparatus whereby the facility at the product test production is directly usable as a quantity production facility.

(2) Since a short-term mass production (a small life production quantity in the same model) is required for the current large item small volume production, there is a requirement to develop a parts mounting apparatus capable of coping flexibly with a variation of model while maintaining the high-speed performance.

(3) A further requirement is to develop a small-sized parts mounting apparatus having a high space productivity and applicable over the multi-generational products.

SUMMARY OF THE INVENTION

The present invention has been developed in consideration of the above-mentioned situations, and it is therefore an object of the invention to provide a parts mounting and assembling apparatus combining a high-speed high-precision characteristic equivalent to that of a die bonder and a flexibility of coping quickly with a process variation and product variation along with size reduction and economics and further divertible over the multi-generational products.

For this purpose, in accordance with an aspect of a present invention, there is provided a parts mounting and assembling apparatus comprising a base unit including a body containing a device to be used in common among a plurality of processes for mounting and assembling parts, a conveying mechanism for conveying a workpiece, which is an object of mounting and assembling, on the body in a predetermined conveying direction along a manufacturing line and a positioning mechanism for placing the workpiece at a predetermined position in the predetermined conveying direction, a dedicated unit including an end effector for conducting processing on the workpiece or a part to be mounted on in the workpiece, according to each of the processes, and a selected mechanism unit including a moving mechanism for moving the end effector in two axial directions perpendicular to the predetermined conveying direction in each of the processes to adjust a relative position between the end effector and the workpiece or the part for positioning, wherein the moving mechanism is selected from a plurality of types according to the contents of each of the processes to be interchangeably attached as the selected mechanism unit with respect to the base unit, and the end effector is selected from a plurality of types according to the contents of each of the processes to be interchangeably attached as the dedicated unit with respect to the moving mechanism.

In this parts mounting and assembling apparatus, it is also appropriate that the selected mechanism unit further includes an aligner mechanism for adjusting a horizontal position of the workpiece or part to be introduced into the manufacturing line by the end effector or adjusting a horizontal position of the workpiece taken out from the manufacturing line by the end effector and the aligner mechanism is selected from a plurality of types according to the contents of each of the processes to be interchangeably attached as the selected mechanism unit with respect to the base unit, and the dedicated unit further includes a fixing mechanism for fixing the workpiece or the part at a predetermined position on the aligner mechanism and the fixing mechanism is selected from a plurality of types according to the contents of each of the processes to be interchangeably attached as the dedicated unit with respect to the aligner mechanism.

In addition, it is also appropriate that this parts mounting and assembling apparatus is made to be connectable to parts mounting and assembling apparatuses for other processes in the predetermined conveying direction and, at the connection with the other-process parts mounting and assembling apparatuses, the conveying mechanism is made to deliver the workpiece to a conveying mechanism of the other-process parts mounting and assembling apparatus adjacent thereto.

Still additionally, it is also appropriate that the body of the base unit accommodates, as the device, an input/output unit functioning as an input/output interface for interchanging a signal with respect to an external controller or a control unit of a parts mounting and assembling apparatus for other process.

Yet additionally, it is also appropriate that, in the body of the base unit, a fundamental frame member having an H-shaped cross section is disposed along an axis of the body.

With the parts mounting and assembling apparatus according to the present invention, the base unit is used in common irrespective of a product model variation or manufacturing process, and the selected mechanism unit is selected to the contents of each process to be interchangeably attached with respect to this base unit and the dedicated unit is selected to the contents of each process to be interchangeably attached, thereby making a dedicated parts mounting and assembling apparatus which takes charge of one process in manufacturing one production (at the parts mounting and assembling). This allows the base unit to be used for diverse processes or over multi-generational products, and since the selected mechanism unit and the dedicated unit are interchanged according to the contents of the process, it is possible to cope very flexibly and quickly with a manufacturing process variation and product model variation, which contributes greatly to shortening the manufacturing term and reducing the manufacturing cost. Moreover, owing to the above-mentioned flexibility of the parts mounting and assembling apparatus according to the present invention, the selected mechanism unit and the dedicated unit can quickly be changed between the product test production and the quantity production so that the facilities for the product test production can substantially directly be used as the facilities for the quantity production.

In addition, since the parts mounting and assembling apparatus according to the present invention is made to be connectable to an other-process parts mounting and assembling apparatus in a predetermined conveying direction and, at the connection with the other-process parts mounting and assembling apparatus, the conveying mechanism of the base unit is made to deliver a workpiece to a conveying mechanism of the other-process parts mounting and assembling apparatus adjacent thereto, the conveying mechanism acts as a line conveyer, which enables a manufacturing line comprising many processes to be easily constructed. That is, the parts mounting and assembling apparatus according to the present invention has a build-up system construction whereby a line establishment or a multi-function system is easily realizable.

Still additionally, since the input/output unit for the interchange of a signal with an external controller or a control unit of the other-process parts mounting and assembling apparatus is built in the body of the base unit, the parts mounting and assembling apparatus according to the present invention can be made independent in the form of a single apparatus, which enhances the combining function of the parts mounting and assembling apparatus with other facilities and easily realizes the hybrid line construction.

Yet additionally, since, in the body of the base unit, a fundamental frame member having an H-shaped cross section is disposed along an axis of the body, not only a high rigidity needed for the high precision is obtainable but also size and weight reduction is realizable, and even the accommodation ability for diverse devices and the three-dimensional extensibility of the base unit are increasable. Moreover, the employment of the frame with an H-shaped cross section enables easy reinforcement and, when needed, further enhancement of the rigidity.

DESCRIPTION OF THE PREFERRED EMBODIMENTS

An embodiment of the present invention will be described hereinbelow with reference to the drawings.

[1] Description of Embodiment of the Invention

[1-1] Basic Construction of Single Parts Mounting and Assembling Cell

Figure 1:
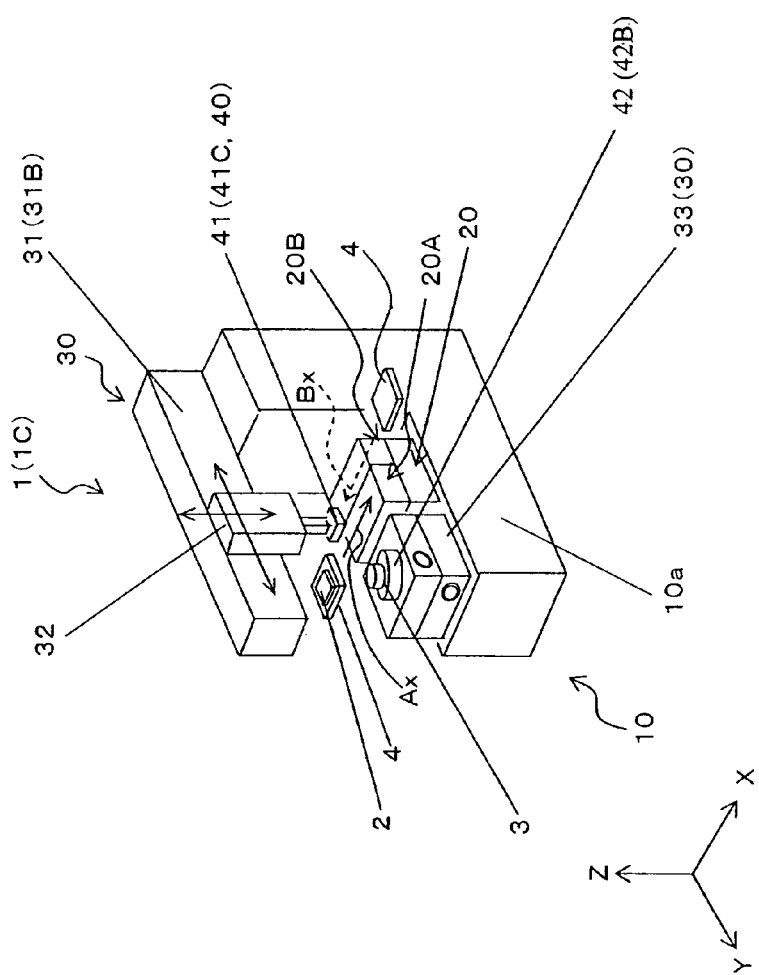
FIG. 1 is a perspective view illustratively showing appearance and construction of a parts mounting and assembling apparatus according to an embodiment of the present invention.

FIG. 1 is a perspective view illustratively showing an appearance/construction of a parts mounting and assembling apparatus (parts mounting/assembling cell) according to an embodiment of the present invention. As FIG. 1 shows, in this embodiment, the parts mounting/assembling cell 1 is provided for each of a plurality of processes in mounting/assembling given products (parts), and it is roughly composed of three sections of a base unit 10, a selected mechanism unit 30 and a dedicated unit 40. The parts mounting/assembling cell 1 shown in FIG. 1 corresponds to a parts placing process (placing cell 1C) in a manufacturing line shown in FIG. 2.

[1-1-1] Base Unit

In a construction of the base unit 10, as will be described later with reference to FIG. 4, a device to be used in common among a plurality of processes for the parts mounting/assembling is incorporated into a body (casing) 10a, and an X-axis conveying mechanism 20 is provided for conveying a pallet 4 on the body 10a.

The X-axis conveying mechanism 20 is made up of a conveyance system corresponding to two lines which are a conveyance positioning mechanism 20A and a pallet return mechanism 20B. These two lines are disposed in parallel with each other.

The conveyance positioning mechanism (pallet feed mechanism) 20A functions as a conveying mechanism for conveying a workpiece (work) 2, placed on a pallet 4, in a predetermined conveying direction (an X-axis direction, a direction indicated by an arrow Ax in FIG. 1) along the manufacturing line, and further functions as a positioning mechanism for placing the workpiece 2 at a predetermined position in the predetermined conveying direction, and as will be described later with reference to FIGS. 10 to 15, in fact it is constructed with a combination of a multi-point robot, a roller conveying mechanism, a cylinder elevating and lowering mechanism (elevating/lowering mechanism) and other components.

The pallet return mechanism 20B is for conducting the return conveyance of a free pallet 4 (in a direction opposite to the aforesaid predetermined conveying direction, i.e., the conveyance in a direction indicated by an arrow Bx in FIG. 1), and as will be described later with reference to FIGS. 10 and 12, in fact it is constructed with a roller conveying mechanism or the like.

Furthermore, the parts mounting/assembling cell 1 according to this embodiment is designed to be connectable to a parts mounting/assembling cell 1 for other process in the predetermined conveying direction and at the connection with the other-process parts mounting/assembling cell 1, the X-axis conveying mechanism 20 (20A, 20B) is made to be capable of handing over to the X-axis conveying mechanism 20 (20A, 20B) of the other-process parts mounting/assembling cell 1 adjacent thereto. That is, the conveyance positioning mechanism 20A is made to feed the pallet 4 carrying the workpiece 2 to the adjacent other-process parts mounting/assembling cell 1 in the predetermined conveying direction (X-axis direction, direction indicated by a solid line arrow Ax in FIG. 1) after the completion of a predetermined process in this cell 1, while the pallet return mechanism 20B is made to feed only the pallet 4 (free pallet 4) to the adjacent other-process parts mounting/assembling cell 1 in a direction (direction indicated by a dotted line arrow Bx in FIG. 1) opposite to the predetermined conveying direction.

The base unit 10 thus constructed is usable in common irrespective of a product model variation and a manufacturing process variation and is divertible (also applicable) throughout diverse processes and multi-generational products. Moreover, the base unit 10 is directly reusable in establishing a manufacturing line for other products, which contributes to shortening the manufacturing term and reducing the manufacturing cost.

[1-1-2] Selected Mechanism Unit

The selected mechanism unit 30 includes a Y-axis moving mechanism 31, a Z-axis moving mechanism 32 and an aligner mechanism 33.

The Y-axis moving mechanism 31 and the Z-axis moving mechanism 32 respectively moves an end effector 41, mentioned later, in two axial directions (Y-axis direction and Z-axis direction in FIG. 1) perpendicular to the aforesaid predetermined conveying direction in each process to adjust (positioning) the relative position between the end effector 41 and the workpiece 2 or a part 3 to be mounted in this workpiece 2. As the Y-axis moving mechanism 31, for example, there is used a Y-axis two-point positioning mechanism comprising a two-point cylinder or a multi-point robot, a Y-axis multi-point positioning mechanism, a Y-axis one-point positioning mechanism, or the like, and as the Z-axis moving mechanism 32, for example, there is used a Z-axis two-point positioning mechanism comprising a two-point cylinder or a multi-point robot, or the like.

The aligner mechanism 33 is for adjusting a horizontal position (position in an X-Y plane) of a workpiece 2/part 3 to be introduced into a manufacturing line by the end effector 41, mentioned later, or a workpiece 2 taken out from the manufacturing line by the end effector 41. As this aligner mechanism 33, for example, there is used an X-Y precision stage, an X-Y rotational precision stage, an automatic recognition correction stage, or the like.

Moreover, each of the moving mechanisms 31 and 32 is selected from a plurality of types (all the above-mentioned sorts of mechanisms including the two-point cylinder, the multi-point robot and others) in accordance with the contents of each process and is interchangeably attached as the selected mechanism unit 30 with respect to the base unit 10. Still moreover, the aligner mechanism 33 is selected from a plurality of types (all the above-mentioned sorts of stages) in accordance with the contents of each process to be interchangeably attached as the selected mechanism unit 30 with respect to the base unit 10.

Figure 2:
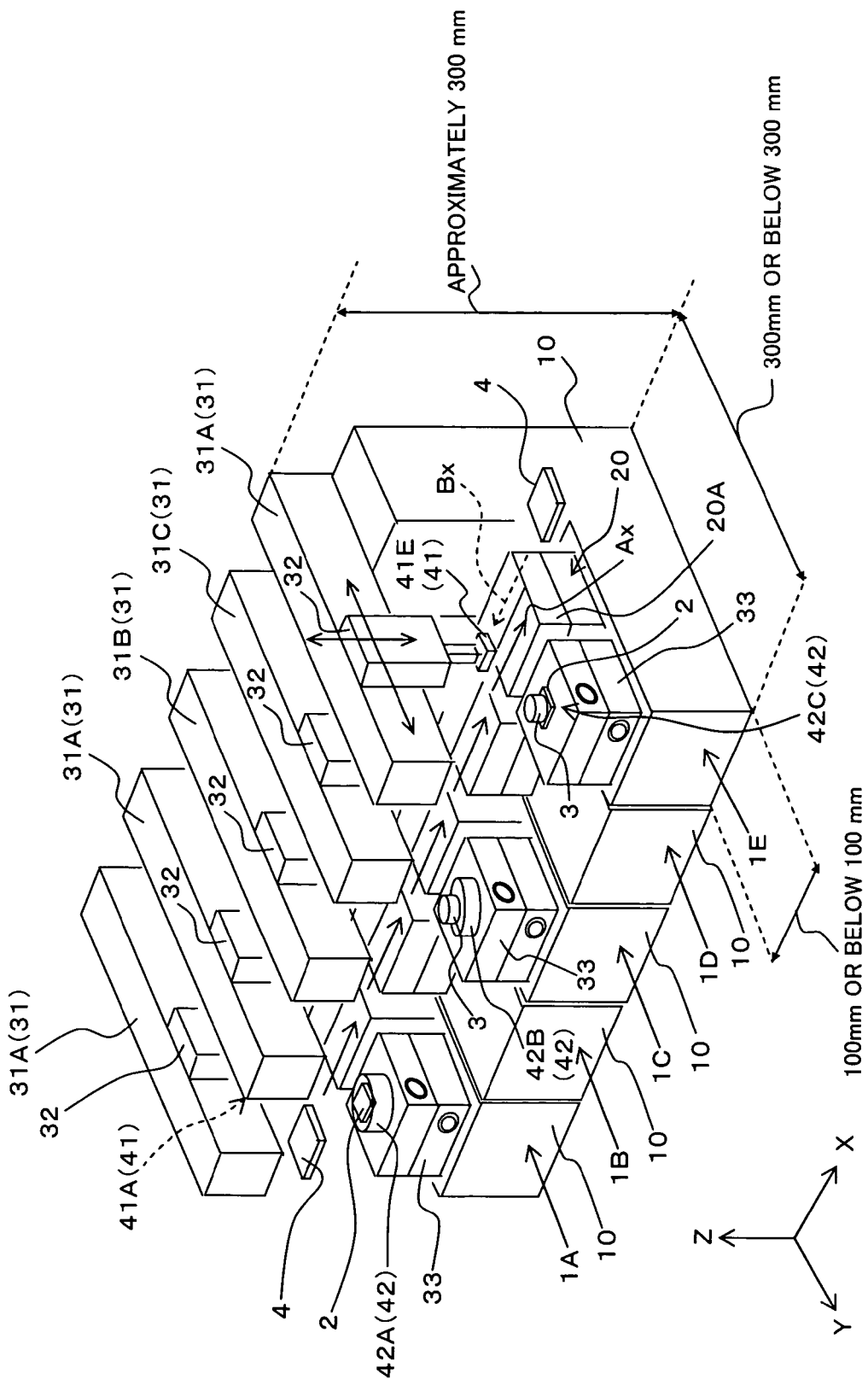
FIG. 2 is a perspective view illustratively showing a manufacturing line constructed by making connections between parts mounting and assembling apparatuses according to this embodiment.
Figure 3:
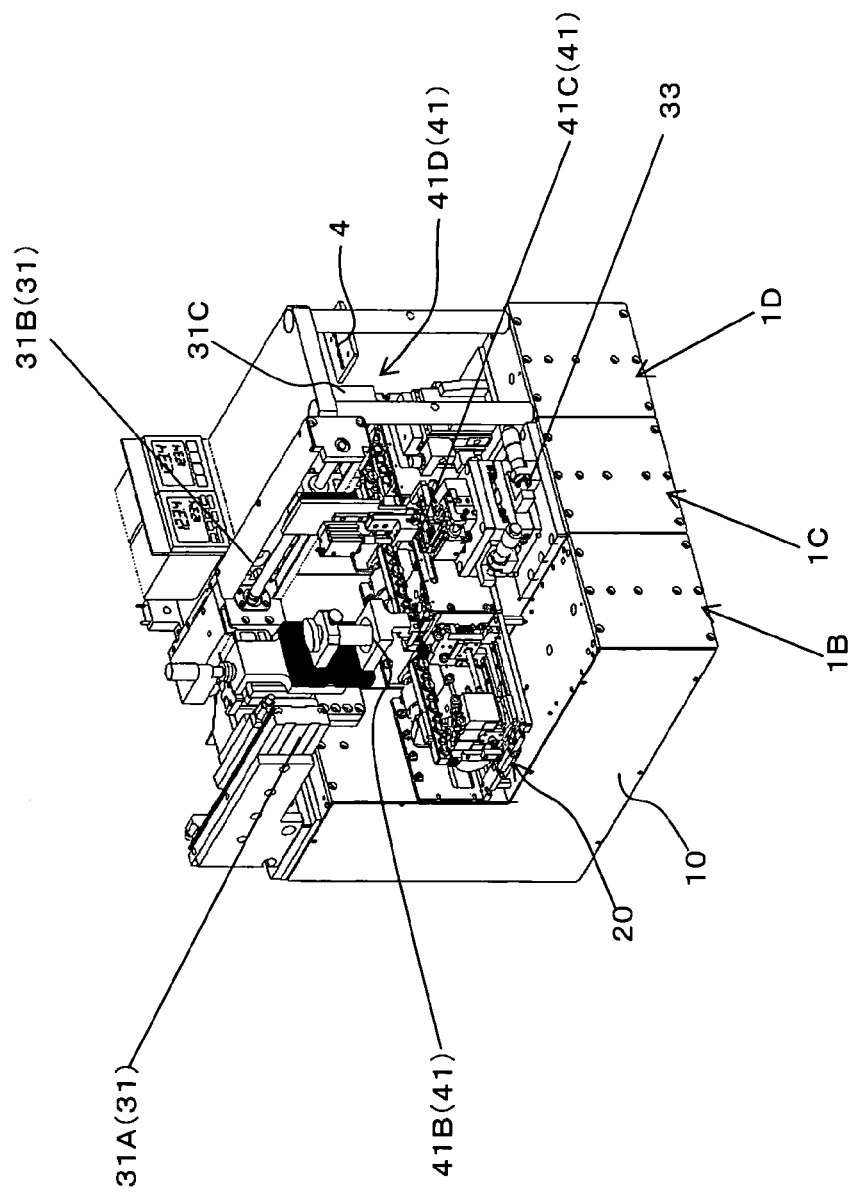
FIG. 3 is a detailed perspective view showing an essential part of the manufacturing line shown in FIG. 2.

Incidentally, since the parts mounting/assembling cell 1 shown in FIG. 1 corresponds to the placing cell 1C as mentioned above, as will be described later with reference to the Table 1 and FIGS. 2 and 3, FIG. 1 shows an example in which a Y-axis multi-point positioning mechanism 31B and a Z-axis two-point positioning mechanism 32 are selected and attached as the moving mechanisms 31 and 32, respectively, and a stage capable of accomplishing the position adjustment in X and Y two-axial directions is selected and attached as the aligner mechanism 33.

The selected mechanism unit 30 (the moving mechanisms 31, 32 and the aligner mechanism 33) thus constructed is selected in accordance with a variation of assembling process (variation of number of positioning points or stroke) and interchangeably attached on the base unit 10 and, hence, if only the unit 30 is developed to the function of the assembling process or purchased as a unit on the market, the excessive function/excessive performance is avoidable, thereby enabling the reduction of the manufacturing cost.

[1-1-3] Dedicated Unit

The dedicated unit 40 includes an end effector (end tentacle) 41 for conducting the processing on the workpiece 2 or the part 3 according to each process and a fixing mechanism 42 for fixing the workpiece 2 or the part 3 at a predetermined position on the aligner mechanism 33. As the end effector 41 to be used, for example, there are a part suction hand, a work suction hand, a dispenser, a squeegee applying hand, a heating/pressing head, a work load hand, an unload hand, and others. Moreover, as the fixing mechanism 42, for example, there is used a dedicated-to-part fixing mechanism for all the sorts of parts 3, a dedicated-to-work fixing mechanism for all the sorts of workpieces 2.

In addition, the end effector 41 is selected from a plurality of types (the above-mentioned hands and heads) according to the contents of each process and interchangeably attached as the dedicated unit 40 with respect to the tip portion of the Z-axis moving mechanism 32, while the fixing mechanism 42 is selected from a plurality of types (the above-mentioned fixing mechanisms) according to the contents of each process and interchangeably attached as the dedicated unit 40 on the aligner mechanism 33.

Incidentally, since the parts mounting/assembling cell 1 shown in FIG. 1 corresponds to the placing cell 1C as mentioned above, as will be described later with reference to the Table 1 and FIGS. 2 and 3, FIG. 1 shows an example in which a part suction hand (suction hand) 41C is selected and attached as the end effector 41, and a dedicated-to-part fixing unit 42B is selected and attached as the fixing mechanism 42.

The dedicated unit 40 thus constructed is a unit whose functional performance varies due to a change of product, and the effector 41 and the fixing mechanism 32, serving as the dedicated unit 40, are selected according to a change of product and interchangeably attached on the Z-axis moving mechanism 32 and the aligner mechanism 33, respectively, and the facility developer can detach the dedicated unit 40 from the above-mentioned two units 10 and 30 to develop the assembling element technique. Therefore, the facility developer can concentrate on developing the assembling element technique and the end effector 41, thereby shortening the development term and the improving the facility quality.

[1-1-4] Operation Sequence of Parts Mounting/Assembling Cell

A parts placing operation sequence by the parts mounting/assembling cell 1 (1C) thus constructed is made as the following (a) to (f).

(a) A part 3 is set on the aligner mechanism 33 and fixed by the dedicated-to-part fixing mechanism 42B.

(b) A pallet 4 on which a workpiece 2 is placed is introduced into the conveyance positioning mechanism (pallet feed mechanism) 20A where the pallet 4 is drawn in the X-axis direction (the aforesaid predetermined conveying direction; the direction indicated by the arrow Ax in FIG. 1) and lifted by the cylinder elevating/lowering mechanism (an elevating/lowering mechanism 23 which will be described later with reference to FIGS. 11 to 15) of the conveyance positioning mechanism 20A to be put at a predetermined position in the X-axis direction.

(c) The end effector 41 is moved to above the part 3, set/fixed on the aligner mechanism 33 in the step (a), by means of the Y-axis moving mechanism 31 and the Z-axis moving mechanism 32 and the part 3 is then sucked by the end effector 41 (part suction hand 41C).

(d) The end effector 41 is moved to above the workpiece 2, placed at a predetermined position in the X-axis direction, by means of the Y-axis moving mechanism 31 and the Z-axis moving mechanism 32 and the part 3 is then placed in the workpiece 2 by the end effector 41 (part suction hand 41C).

(e) The pallet 4 on which the workpiece 2 holding the placed part 3 is mounted is discharged in the predetermined conveying direction by means of the conveyance positioning mechanism (pallet feed mechanism) 20A to be delivered to a parts mounting/assembling cell 1 for the next process.

(f) When all the process reaches completion, the workpiece 2 is unloaded, and that free pallet 4 is conveyed in a direction (direction indicated by the arrow Bx in FIG. 1) opposite to the predetermined conveying direction by means of the pallet return mechanism 20B to be returned from the final-process parts mounting/assembling cell 1 to the first-process parts mounting/assembling cell 1.

[1-1-5] Effects Achievable by Parts Mounting/Assembling Cell

As described above, with the parts mounting/assembling cell 1 shown in FIG. 1, the base unit 10 is usable in common regardless of product model variation or manufacturing process variation, and with respect to this base unit 10, the selected mechanism unit 30 is selected to the contents of each process to be interchangeably attached, and the dedicated unit 40 is selected to the contents of each process, thus providing a dedicated parts mounting/assembling cell 1 (1C) which takes charge of one process (parts placing process in FIG. 1) in manufacturing one product (in the parts mounting/assembling operation).

Accordingly, the base unit 10 is divertible to diverse processes and multi-generational products, and when the selected mechanism unit 30 and the dedicated unit 40 are interchanged according to the contents of a process, it is possible to cope very flexibly and quickly with manufacturing process variation and product model variation, which contributes greatly to shortening the manufacturing term and reducing the manufacturing cost.

Moreover, since the parts mounting/assembling cell 1 has the flexibility as mentioned above, by changing the selected mechanism unit 30 or the dedicated unit 40, it is possible to cope quickly with the facility variation between the product test production and the quantity production, and the facilities (the parts mounting/assembling cell 1, a manufacturing line (mentioned later) comprising a plurality of parts mounting/assembling cells 1) for the product test production is generally usable directly as the quantity production facilities.

[1-2] Manufacturing Line Construction Using Parts Mounting/Assembling Cells

As mentioned above, the parts mounting/assembling cell 1 according to this embodiment is made to be connectable to an other-process parts mounting/assembling cell 1 in the aforesaid predetermined conveying direction and, when a plurality of parts mounting/assembling cells 1 are connected to each other in the predetermined conveying direction, the X-axis conveying mechanism 20 (20A, 20B) is made to hand over the pallet 4 to the X-axis conveying mechanism 20 (20A, 20B) of the adjacent parts mounting/assembling cell 1 so that, as shown in FIGS. 2 and 3, the X-axis conveying mechanisms 20 (20A, 20B) function as a line conveyer.

FIG. 2 is a perspective view illustratively showing a manufacturing line constructed by connecting the parts mounting/assembling cells 1 (1A to 1E) according to this embodiment, and FIG. 3 is a detailed perspective view showing the essential portion (the parts mounting/assembling cells 1B to 1D) of the manufacturing line shown in FIG. 2. The size of each of the cells 1 shown in FIGS. 2 and 3 is set at, for example, an X-axis direction width 100 mm or below 100 mm, a Y-axis direction length 300 mm or below 300 mm and a Z-axis direction height of approximately 300 mm.

The manufacturing line shown in FIGS. 2 and 3 is constructed in a manner such that five parts mounting/assembling cells 1A to 1E are connected to each other so that these parts mounting/assembling cells 1A to 1E implement the following first to fifth processes, respectively.

First Process: In the work load cell 1A, when a free pallet 4 is put (positioned) at a predetermined position, a workpiece 2 fixed on an aligner mechanism 33 by means of a dedicated-to-work fixing mechanism 42A is sucked by a work suction hand (end effector, suction head) 41A to be placed on the pallet 4 by a Y-axis two-point positioning mechanism (Y-axis moving mechanism, two-point cylinder) 31A and a Z-axis two-point positioning mechanism (Z-axis moving mechanism, two-point cylinder) 32, and this pallet 4 (workpiece 2) is conveyed to the next applying cell 1B by means of a pallet feed mechanism 20A.

Second Process: In the applying cell 1B, when the pallet 4 (workpiece 2) is put at a predetermined position, an adhesive is applied at a placing (mounting) position of a part(s) 3 on the workpiece 2 by a dispenser (end effector) 41B, a Y-axis two-point positioning mechanism 31A and a Z-axis two-point positioning mechanism 32 and the pallet 4 (workpiece 2) is conveyed to the next placing cell 1C by a pallet feed mechanism 20A.

Third Process: In the placing cell 1C, when the pallet 4 (workpiece 2) is put at a predetermined position, the part 3 fixed on an aligner mechanism 33 by a dedicated-to-part fixing mechanism 42B is sucked by apart suction hand (end effector, suction head) 41C to be placed/mounted on the workpiece 2 by a Y-axis multi-point positioning mechanism (Y-axis moving mechanism, multi-point robot) 31B and a Z-axis two-point positioning mechanism 32, and the pallet 4 (workpiece 2 and part 3) is conveyed to the next pressuring cell 1D by a pallet feed mechanism 20A (in detail, see (a) to (e) of the above-mentioned operation sequence).

Fourth Process: In the pressuring cell 1D, when the pallet 4 (workpiece 2 and part 3) is put at a predetermined position, the part 3 is pressed against the workpiece 2 by means of a pressuring head (end effector) 41D, a Y-axis two-point positioning mechanism 31A and a Z-axis two-point positioning mechanism 32, and the pallet 4 (workpiece 2 and part 3) is conveyed to the next work unload cell 1E by a pallet feed mechanism 20A.

Fifth Process: In the work unload cell 1E, when the pallet 4 (workpiece 2 and part 3) is put at a predetermined position, the workpiece 2, on which the part 3 is mounted, is sucked by a work suction hand (end effector, suction head) 41E to be taken out (unloaded) from the pallet 4 (manufacturing line) onto an aligner mechanism 33 by a Y-axis two-point positioning mechanism 31A and a Z-axis two-point positioning mechanism 32, with the workpiece 2 being fixed on the aligner mechanism 33 by a dedicated-to-part fixing mechanism 42C.

In this connection, it is also appropriate to employ a reversing mechanism (not shown) whereby the pallet 4 which becomes free because the workpiece 2 is unloaded is remounted from the pallet feed mechanism 20A side onto the pallet return mechanism 20B side in the aforesaid predetermined conveying direction beyond the work unload cell 1E. Owing to the employment of such a reversing mechanism, the pallet 4 which becomes free because the workpiece 2 is unloaded is automatically handed over from the pallet feed mechanism 20A side to the pallet return mechanism 20B side and is conveyed in a direction (direction indicated by a dotted line arrow Bx in FIG. 2) opposite to the aforesaid predetermined conveying direction by the pallet return mechanism 20B to be returned from the fifth-process cell 1E side to the first-process cell 1A side.

The units (units of the cells 1A to 1E) to be selected in the cells 1A to 1E for conducting the above-mentioned first to fifth processes in the manufacturing line, described above with reference to FIGS. 2 and 3, are as shown in the following table 1.

TABLE 1

| UNITS | BASE UNITS | | SELECTED | | | DEDICATED UNITS | |
|---|---|---|---|---|---|---|---|
| MECHANISM/ | | X-AXIS | MECHANISM UNITS | | | FIXING | END |
| MODULE | BODY | CONVEYANCE | Y-AXIS | Z-AXIS | ALIGNER | MECHANISM | EFFECTOR |
| WORK LOAD | COMMON | COMMON | TWO POINTS | TWO POINTS | TWO AXES | DEDICATED-TO-WORK 1 | WORK SUCTION HAND 1 |
| APPLYING CELL | COMMON | COMMON | TWO POINTS | TWO POINTS | — | — | DISPENSER |
| PLACING CELL | COMMON | COMMON | MULTI POINTS | TWO POINTS | TWO AXES | DEDICATED-TO-PART | PART SUCTION HAND |
| PRESSURING CELL | COMMON | COMMON | ONE POINT | TWO POINTS | — | — | PRESSURING HEAD |
| WORK UNLOAD | COMMON | COMMON | TWO POINTS | TWO POINTS | TWO AXES | DEDICATED-TO-WORK 2 | WORK SUCTION HAND 2 |

As shown in the table 1, the base unit 10 (body 10a and X-axis conveying mechanism 20) is in common among the cells 1A to 1E. Moreover, in the "Y-Axis" column of the "Selected Mechanism Units" in the table 1, the "two points" signifies that a Y-axis two-point positioning mechanism 31A comprising a two-point cylinder is used as the selected mechanism unit 30, and the "multi points" signifies that a Y-axis multi-point positioning mechanism 31B comprising a multi-point robot is used as the selected mechanism unit 30, and the "one point" signifies that a Y-axis one-point positioning mechanism 31C is used as the selected mechanism unit 30. Still moreover, in the "Z-Axis" column of the "Selected Mechanism Units" in the table 1, the "two points" represents that a Z-axis two-point positioning mechanism 32 comprising a two-point cylinder is used as the selected mechanism unit 30. Yet moreover, in the "Aligner" column of the "Selected Mechanism Units" in the table 1, the "two axes" represents that an aligner mechanism 33 including a stage capable of accomplishing the position adjustment in X and Y two-axial directions is used as the selected mechanism unit 30, and "–" denotes no use of the aligner mechanism. In addition, in the "Fixing Mechanism" column of the "Dedicated Units" in the table 1, the "dedicated-to-work 1" indicates that a dedicated-to-work fixing mechanism 42A is used as the fixing mechanism 42, the "dedicated-to-part" indicates that a dedicated-to-part fixing mechanism 42B is used as the fixing mechanism 42, the "dedicated-to-work 2" indicates that a dedicated-to-work fixing mechanism 42C is used as the fixing mechanism 42, and the "–" indicates no use of a fixing mechanism. Still additionally, in the "End Effector" column of the "Dedicated Units" in the table 1, the "work suction hand 1" indicates that a work suction hand 41A is used as the end effector 41, the "dispenser" indicates that a dispenser 41B is used as the end effector 41, the "part suction hand" indicates that a part suction hand 41C is used as the end effector 41, the "pressuring head" indicates that a pressuring head 41D is used as the end effector 41, and the "work suction hand 2" indicates that a work suction hand 41E is used as the end effector 41.

In this way, the parts mounting/assembling cells 1 (1A to 1E) are designed to be mutually connectable to each other in the predetermined conveying direction, and when these parts mounting/assembling cells 1 (1A to 1E) are connected to each other, the X-axis conveying mechanisms 20 of the base units 10 function as a line conveyer for conveying a workpiece(s) 2 (pallet(s) 4), thereby easily constructing a manufacturing line comprising multiple processes. That is, the parts mounting/assembling cells 1 (1A to 1E) according to this embodiment provide a build-up system construction capable of realizing the line establishment and multi-function system easily. Moreover, as shown in the table 1 and FIGS. 2 and 3, since the base unit 10 is used in common among all the processes, it is possible to cope flexibly with variations such as process addition/deletion.

[1-3] Construction of Base Unit

Figure 4:
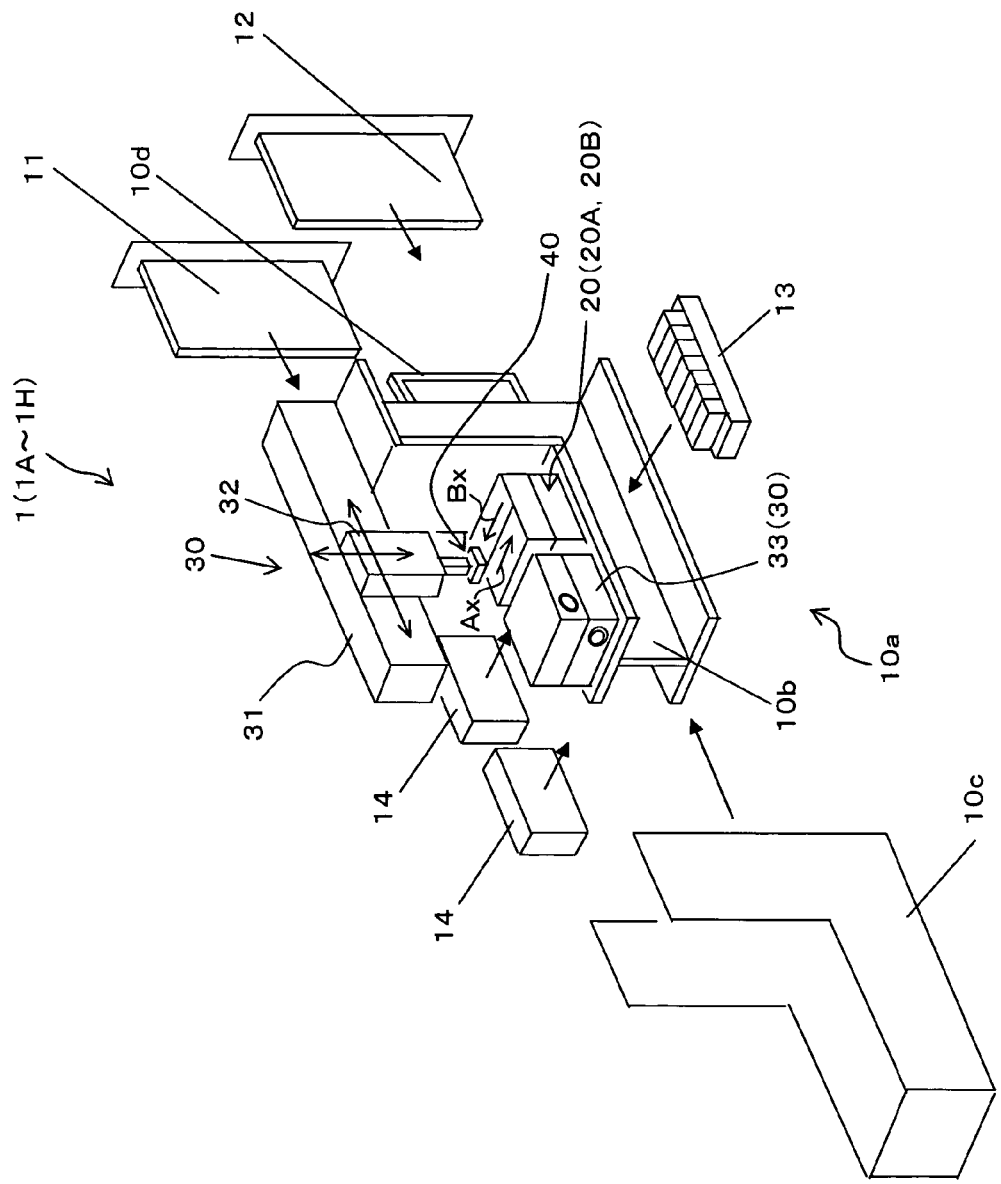
FIG. 4 is an exploded perspective view illustratively showing a construction of a base unit in the parts mounting and assembling apparatus according to this embodiment.

FIG. 4 is an exploded perspective view illustratively showing a construction of the base unit 10 in the parts mounting/assembling cell 1 (1A to 1H) according to this embodiment. As FIG. 4 shows, the body 10a of the base unit 10 is constructed by disposing a base frame 10b, made by forming a frame member with an H-shaped cross section into an L-shaped configuration, along an axis of the body 10a and by locating a cover 10c for covering the side surfaces of the fundamental frame 10b. Moreover, a handhold 10d is fixedly secured to a back surface (rear portion) of the body 10a (reference frame 10b) so that an operator can grip it for the installation of the cell 1, detachment thereof, carrying thereof, and others.

This body 10a internally includes an X-axis conveyance driver board 11, a Y-axis driver board 12 and an electromagnetic solenoid valve 13 which function as a control unit for controlling the operations of the above-mentioned X-axis conveying mechanism 20, moving mechanisms 31, 32, end effector 41 and others, and further internally includes an I/O unit (input/output unit) 14 which functions as an input/output interface for interchanging signals with respect to an external controller (not shown) or a control unit in the parts mounting/assembling cells 1 for other processes.

The X-axis conveyance driver board 11 or the Y-axis driver board 12 functions as a control driver for the mechanism comprising a servo stage, such as the X-axis conveying mechanism or the Y-axis moving mechanism 31, and the electromagnetic solenoid air valve 13 is for drive-controlling a cylinder mechanism used for primary-positioning in the Z-axis moving mechanism 32, the elevating/lowering mechanism 23 (see FIGS. 11 to 15), a portion of the end effector 41, or the like. In addition, when needed, an electromagnetic manifold, a motor driver, a sensor amplifier, a connector and others are incorporated into the body 10a.

As described above, since, for the construction of the base unit 10, the control units 11 to 13 and the I/O unit 14 are incorporated into the body 10a and the X-axis conveying mechanism 20 is provided on the body 10a, not only the enhancement of the control characteristic is feasible, but also the interchangeability between the cells 1 is improvable.

In addition, the incorporation of the I/O unit 14 can enhance the connection with the external controller or the other-process part mounting/assembling cell 1 and can make the part mounting/assembling cell 1 independent as a single cell. Moreover, this enhances the combination of the parts mounting/assembling cell 1 with other facilities and easily realizes the hybrid line construction.

Still additionally, since the control units 11 to 13 and the I/O unit 14 are internally accommodated in the fundamental frame 10b with an H-shaped cross section, the maintenance of the control units 11 to 13 and the I/O unit 14 is improvable.

Yet additionally, since the handhold 10d is set at a rear portion of the base unit 10, an operator can perform the installation, detachment and carrying of the cell 1 through the use of the handhold 10d, thus improving the handling of the cell 1.

[1-4] Fundamental Frame and Frame Extension of Base Unit

Figure 5:
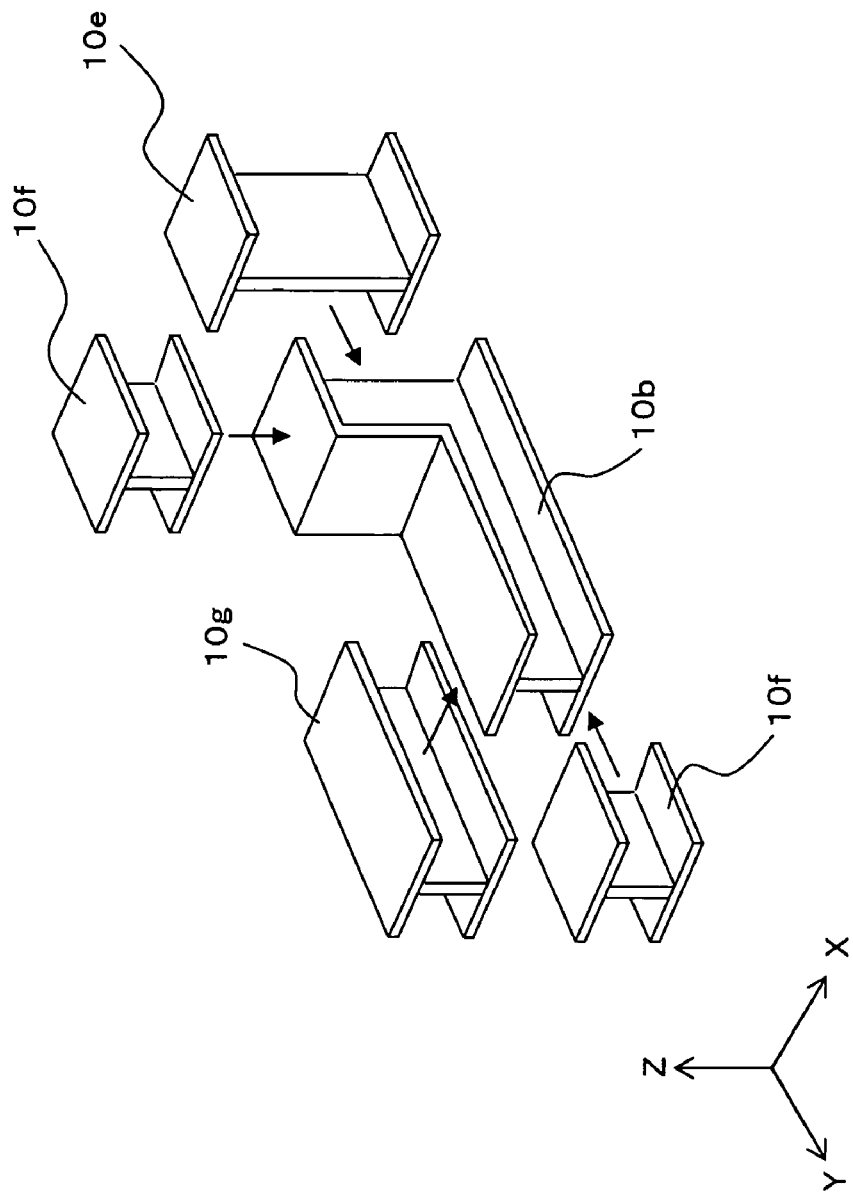
FIG. 5 is an exploded perspective view illustratively showing a fundamental frame and a frame extension in the base unit of the parts mounting and assembling apparatus according to this embodiment.

FIG. 5 is an exploded perspective view illustratively showing the fundamental frame 10b and frame extensions 10e, 10f and 10g in the base unit 10 of the parts mounting/assembling cell 1 (1A to 1H) according to this embodiment. As FIG. 5 shows, the fundamental frame 10b constituting the body 10a is made to be connectable to three types of frame extensions 10e, 10f and 10g for extending the base unit 10. Moreover, each of these frame extensions 10e, 10f and 10g has the same H-shaped cross section as that of the fundamental frame 10b.

The frame extension 10e is used in a state connected to a back surface (rear portion; the right side in FIG. 5) of the fundamental frame 10b in the Y-axis direction in adding a servo motor control driver and others. Moreover, the frame extension 10f is used in a state connected to a front surface (front portion; the left side in FIG. 5) of the fundamental frame 10b in the Y-axis direction in adding a parts supply function, and it is used in a state connected to an upper surface of the fundamental frame 10b in the Z-axis direction in heightening the positions of the moving mechanisms 31, 32 and the end effector 41 with respect to a workpiece 2 high in height. Still moreover, the frame extension 10g is used in a state connected to a side surface of the fundamental frame 10b in a case in which a workpiece 2 is long in the conveying direction (X-axis direction).

Thus, since the body 10a of the base unit 10 is constructed by disposing the fundamental frame 10b with an H-shaped cross section along the axis of the body 10a, the high rigidity needed for the enhancement of accuracy is realizable and the capability of accommodation in the body 10a of each apparatus is improvable.

In particular, in the case of the fundamental frame 10b with an H-shaped cross section and the frame extensions 10e to 10g, as compared with a hollow frame with a rectangular cross section, the number of parts is reducible and the weight reduction and casting become easier. Moreover, in the case of the cell construction according to this embodiment, since the working point in each cell 1 exists around the axis of the body 10a, when the fundamental frame 10b with an H-shaped cross section and the frame extensions 10e to 10g are disposed along the axis of the body 10a, the sufficient strength is obtainable and the rigidity needed for the enhancement of accuracy is securable.

In addition, in the case of the fundamental frame 10b with an H-shaped cross section and the frame extensions 10e to 10g, as shown in FIGS. 4 and 5, their front surfaces, side surfaces and rear surfaces are in an open state, and as mentioned above in the item [1-3], it is possible not only to facilitate the maintenance on the units 11 to 14 accommodated in the body 10a but also to accommodate the units efficiently per unit volume so that the size reduction of the body 10a is achievable.

Still additionally, since the three types of frame extensions 10e to 10g are prepared and are added/connected to the fundamental frame 10b when needed, the three-dimensional extensibility of the base unit 10, i.e., the parts mounting/assembling cell 1 itself, is improvable.

Figure 21:
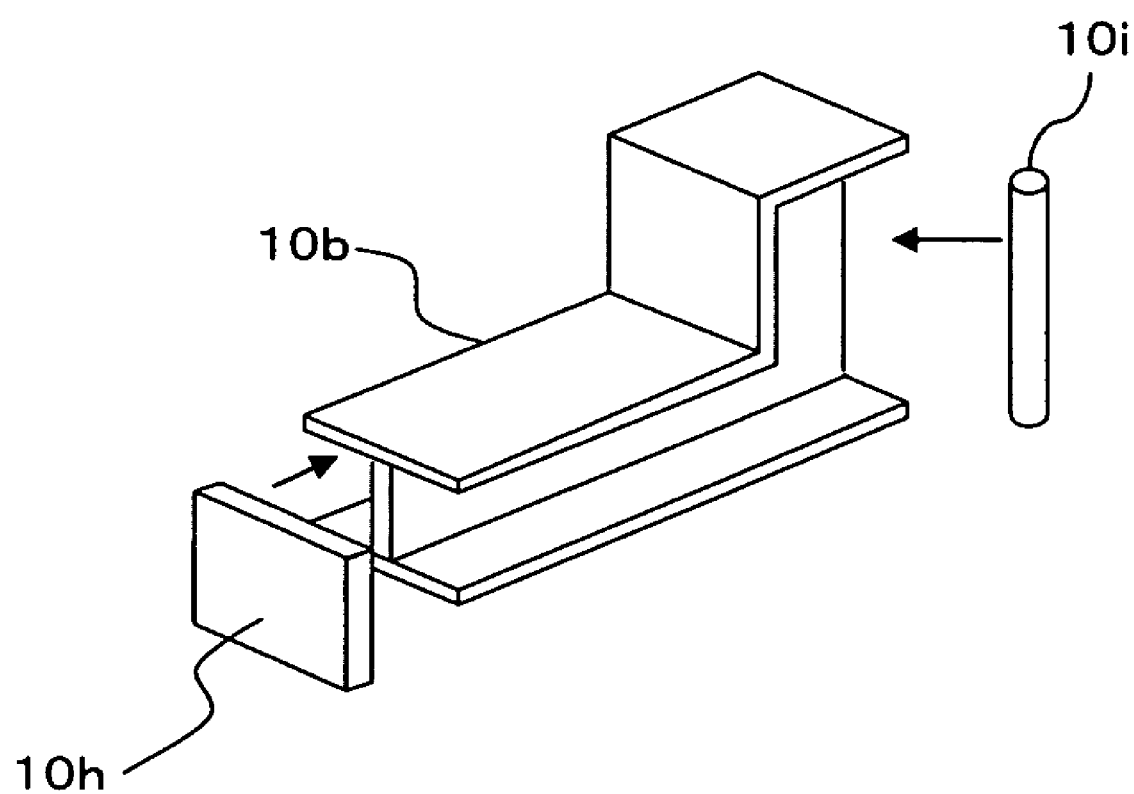
FIG. 21 is an exploded perspective view showing a reinforcement example of a fundamental frame according to this embodiment.

Yet additionally, since the employment of the fundamental frame 10b with an H-shaped cross section and the frame extensions 10e to 10g enables easy reinforcement, the rigidity is improvable when needed. For example, as shown in FIG. 21, a reinforcing plate 10h can be attached to a front surface of the fundamental frame 10b or a reinforcing shaft 10i can be interposed between rear side upper and lower plates of the fundamental frame 10b. This easy reinforcement can enhance the rigidity. FIG. 21 is an explode perspective view showing a reinforcement example on the fundamental frame 10b according to this embodiment. Moreover, the like reinforcement can also be made with respect to the frame extensions 10e to 10g.

[1-5] Ladder-Type Line Chassis and Chassis Extension

Figure 6:
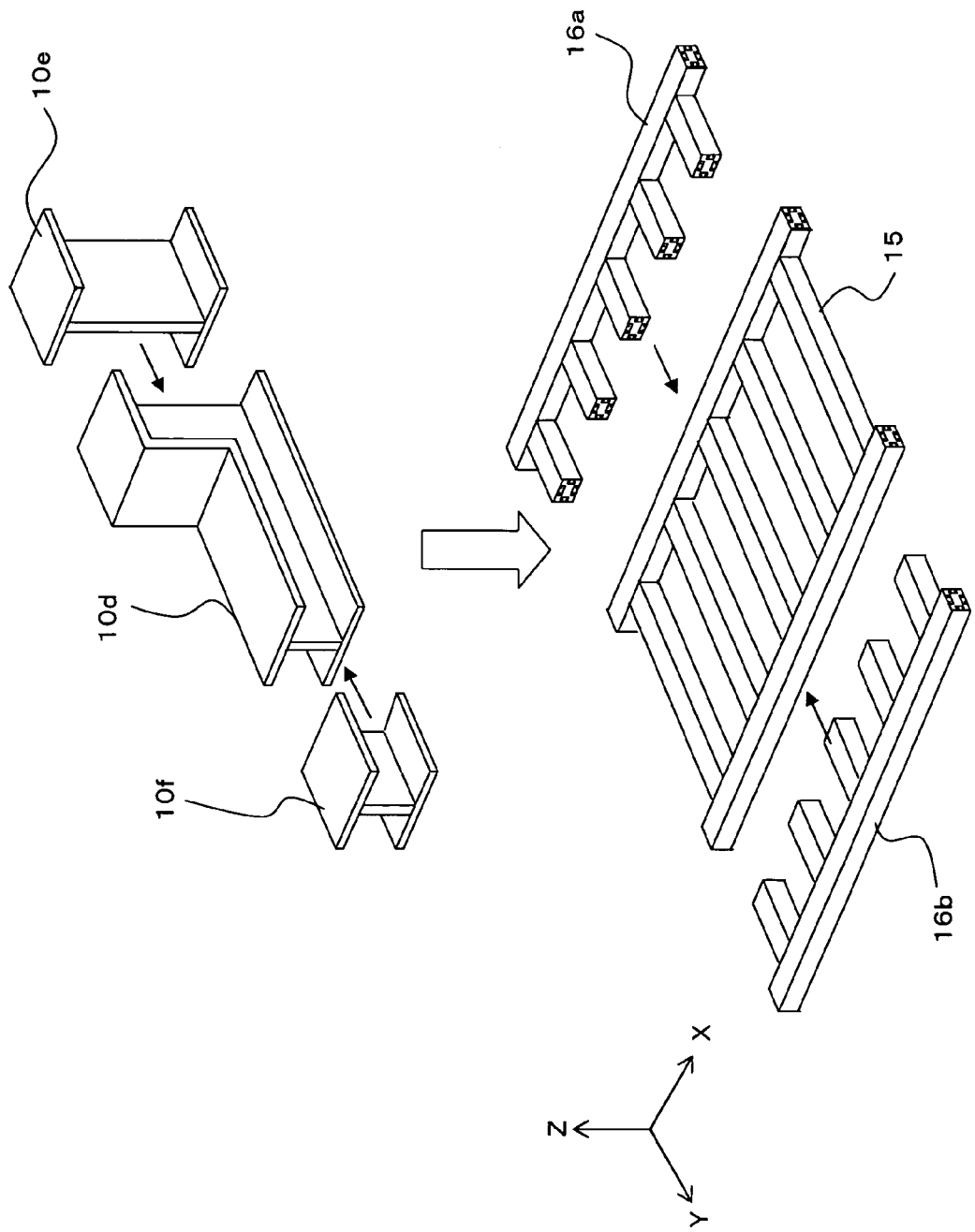
FIG. 6 is an exploded perspective view illustratively showing a ladder type line chassis and a chassis extension for bearing the base unit of the parts mounting and assembling apparatus according to this embodiment.
Figure 7:
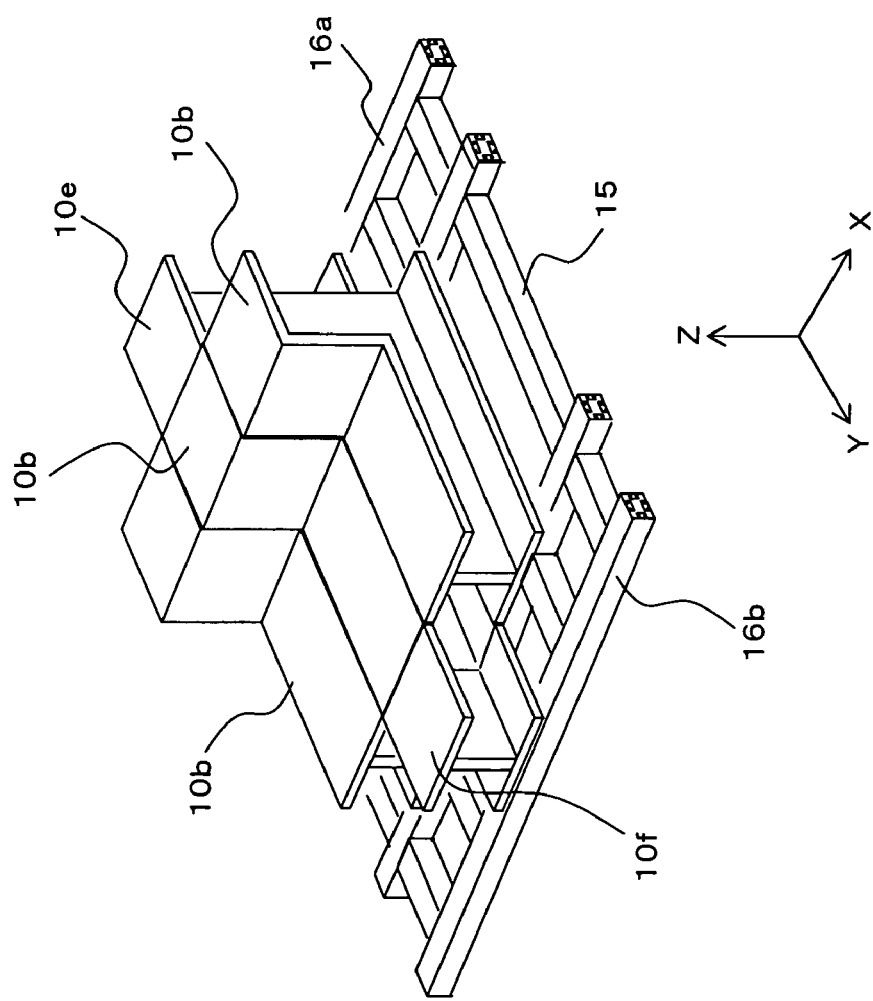
FIG. 7 is a perspective view illustratively showing an example of use (example of assembling) of the ladder type line chassis and the chassis extension shown in FIG. 6.

FIG. 6 is an exploded perspective view illustratively showing a ladder-type line chassis 15 for mounting the base unit 10 in each parts mounting/assembling cell 1 (1A to 1H) according to this embodiment and chassis extensions 16a and 16b, and FIG. 7 is a perspective view illustratively showing an example of use (assembling example) of the ladder-type line chassis 15 and the chassis extensions 16a and 16b shown in FIG. 6.

In this embodiment, in a case in which the parts mounting/assembling cells 1 (1A to 1H) are connected to establish a manufacturing line (line mode), as shown in FIGS. 6 and 7, the fundamental frame 10b (base unit 10) of each cell 1 (1A to 1H) is put (arranged) on the ladder-type line chassis 15 extending in the X-axis direction (in the conveying direction along the manufacturing line), and it is fixedly secured to this ladder-type line chassis 15.

At this time, if the frame extensions 10e and 10f are connected with respect to the fundamental frame 10b, the chassis extensions 16a and 16b are connected to front and rear portions of the ladder-type line chassis 15 in a state associated with the frame extensions 10e and 10f, respectively, and the frame extensions 10e and 10f are put on the chassis extensions 16a and 16b and fixed thereto, respectively.

Moreover, in this embodiment, the ladder-type line chassis 15 and the chassis extensions 16a and 16b are formed as an aluminum-made frame with a dovetail groove (not shown), and a movable nut (not shown) is placed in the dovetail groove to be slidable along the dovetail groove. Through the use of this movable nut, the fundamental frame 10b (frame extension 10g) and the frame extensions 10e and 10f are fixedly secured to the ladder-type line chassis 15 and the chassis extensions 16a and 16b, respectively.

As mentioned above, since the parts mounting/assembling cell 1 is disposed and fixed on the ladder-type line chassis 15 and the chassis extensions 16a and 16b, it is possible to cope very flexibly with the connection and extension of various types of cells 1, and since each cell 1 is fixed through the use of the movable nut made to slide in the dovetail grooves of the ladder-type line chassis 15 and the chassis extensions 16a and 16b, an extremely flexible handling on a change of the cell 1 fixed position becomes feasible.

[1-6] Movable Frame

Figure 8:
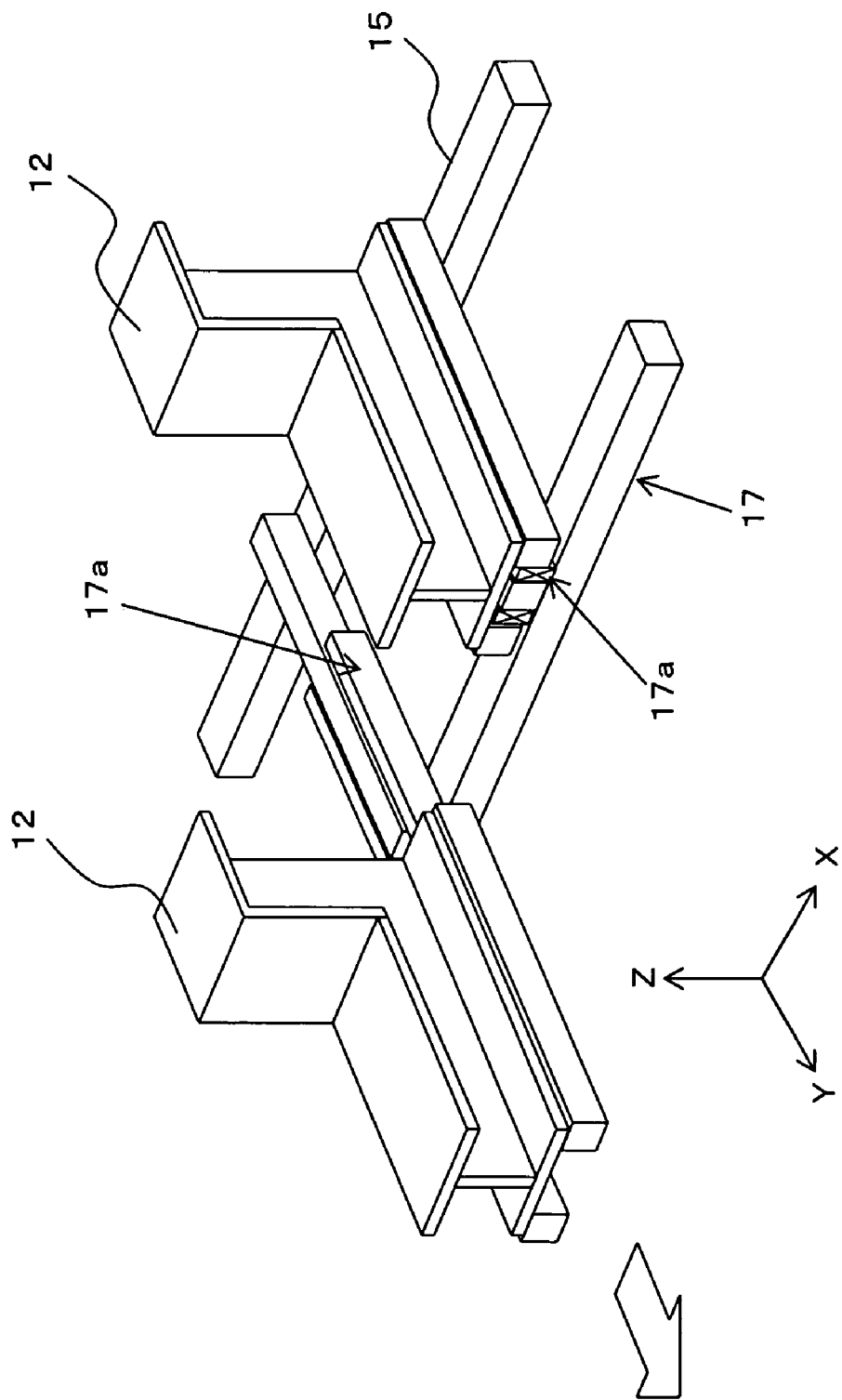
FIG. 8 is a perspective view illustratively showing a basic construction of a movable frame bearing the base unit of the parts mounting and assembling apparatus according to this embodiment.
Figure 9:
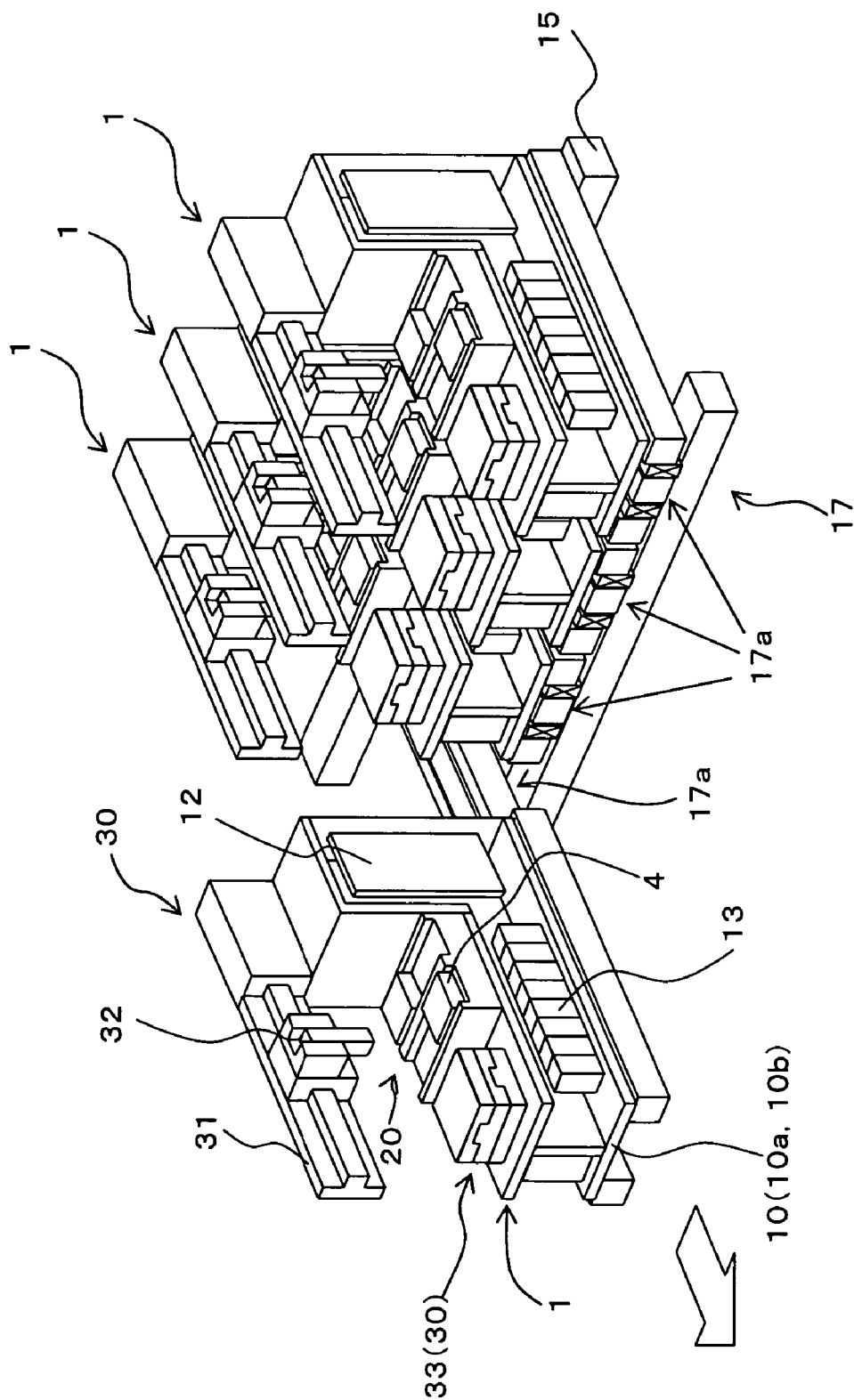
FIG. 9 is a perspective view illustratively showing a manufacturing line constructed by arranging a plurality of parts mounting and assembling apparatuses in the movable frame basic construction shown in FIG. 8.

FIG. 8 is a perspective view illustratively showing a fundamental structure 17 of a movable frame for arranging the base unit 10 of each of the parts mounting/assembling cells 1 (1A to 1H), and FIG. 9 is a perspective view illustratively showing a manufacturing line constructed by setting a plurality of (four in FIG. 9) parts mounting/assembling cells 1 (1A to 1H) on the movable frame fundamental structure 17 shown in FIG. 8. In the illustrations, the same reference numerals as those used above denote the same or substantially corresponding parts, and the description thereof will be omitted for brevity.

The construction of the movable frame fundamental structure 17 according to this embodiment, shown in FIG. 8, is by attaching movable guides 17a, each of which operates in a horizontal direction (Y-axis direction) perpendicular to the aforesaid predetermined conveying direction (direction indicated by an arrow Ax), on a ladder-type line chassis 15 approximately similar in structure to that shown in FIGS. 6 and 7. On this movable frame fundamental structure 17, as shown in FIGS. 8 and 9, the fundamental frame 10b of the base unit 10 is arranged through the movable guides 17a, and the base unit 10, together with the selected mechanism unit 30 and the dedicated unit 40 (that is, the entire parts mounting/assembling cell 1), can be drawn out from the ladder-type line chassis 15 in the aforesaid horizontal direction (Y-axis direction).

Although not shown in FIGS. 8 and 9, in a case in which the frame extensions 10e and 10f are connected to the fundamental frame 10b of the base unit 10 and, associated therewith, the chassis extensions 16a and 16b are connected to the ladder-type line chassis 15, the fundamental frame 10b of the base unit 10 and the frame extensions 10e and 10f are arranged through the movable guides 17a on the ladder-type line chassis 15 and the chassis extensions 16a and 16b, so the base unit 10, together with the selected mechanism unit 30 and the dedicated unit 40, can be drawn out from on the ladder-type line chassis 15 and the chassis extensions 16a and 16b in the aforesaid horizontal direction (Y-axis direction).

Thus, as shown in FIG. 9, the respective parts mounting/assembling cells 1 (1A to 1H) constituting a manufacturing line can be drawn out in the Y-axis direction by means of the movable guides 17a, which permits extremely easy operations, such as maintenance, inspection, management and others, on the respective parts mounting/assembling cells 1 (1A to 1H).

[1-7] X-Axis Conveying Mechanism (Conveyance Positioning Mechanism) in Base Unit Secondly, referring to FIGS. 10 to 15, a description will be given hereinbelow of a detailed construction of the X-axis conveying mechanism 20 of the base unit 10, that is, detailed constructions of the conveyance positioning mechanism (pallet feed mechanism) 20A and the pallet return mechanism 20B.

Figure 10:
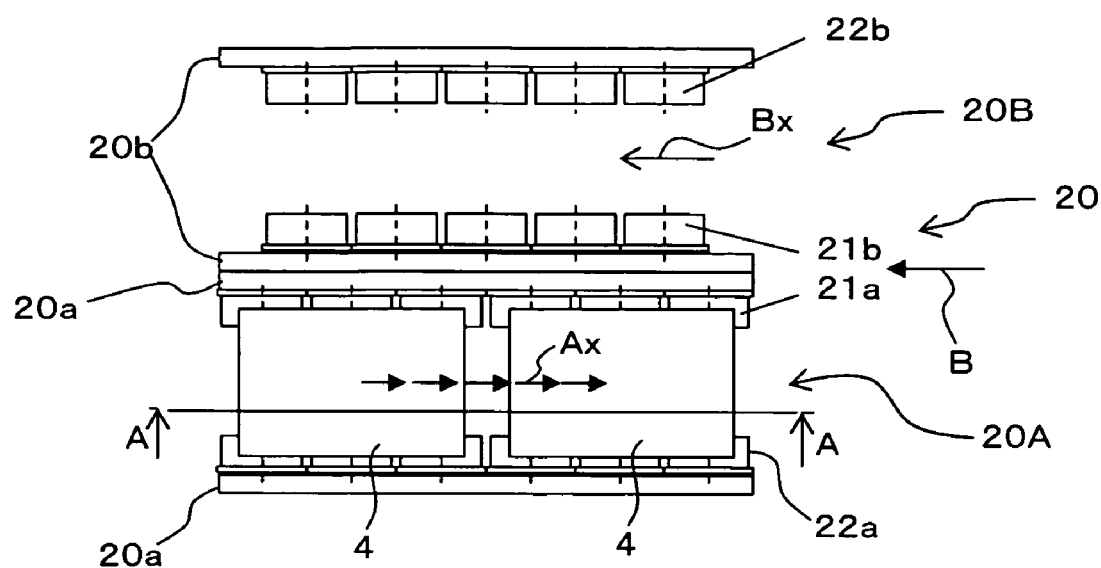
FIG. 10 is a plan view illustratively showing a conveyance positioning mechanism (pallet feed mechanism) and a pallet return mechanism in the base unit according to this embodiment.
Figure 11:
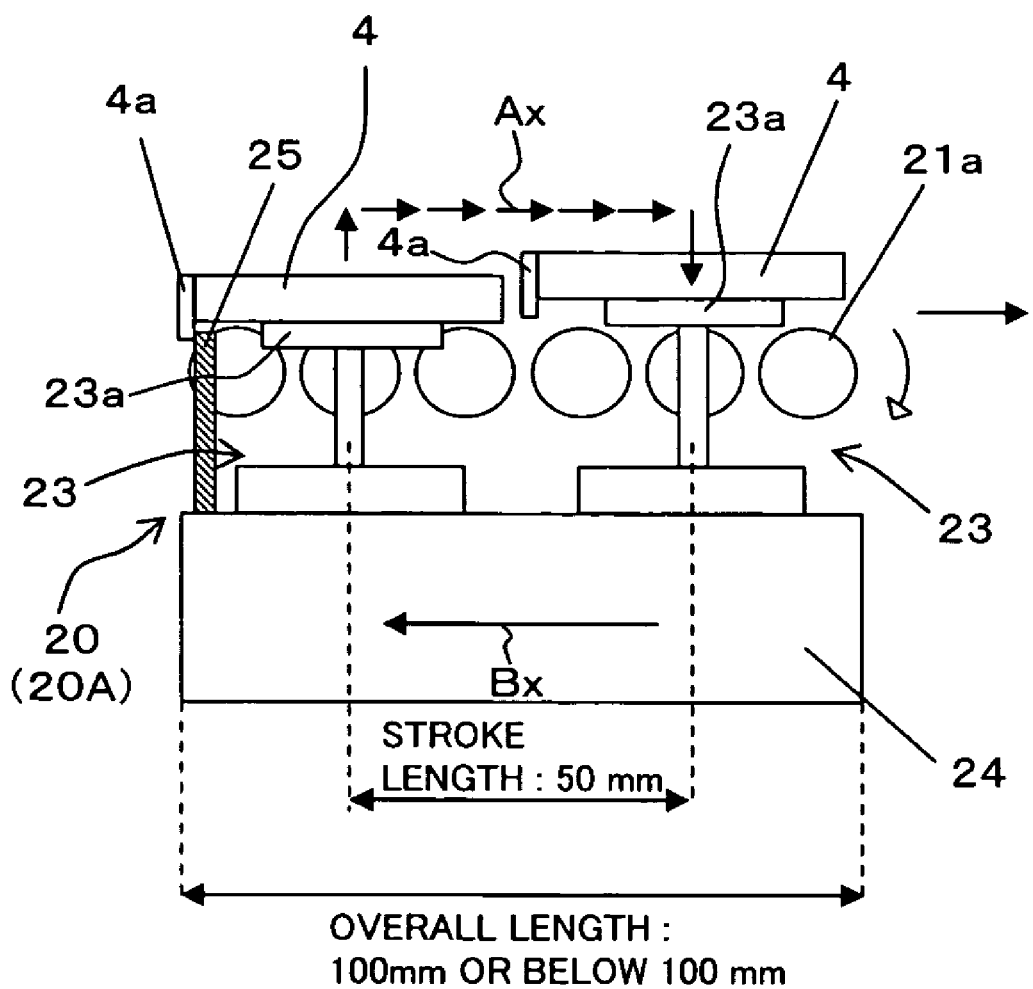
FIG. 11 is an illustrative cross-sectional view taken along a line A—A of FIG. 10.
Figure 12:
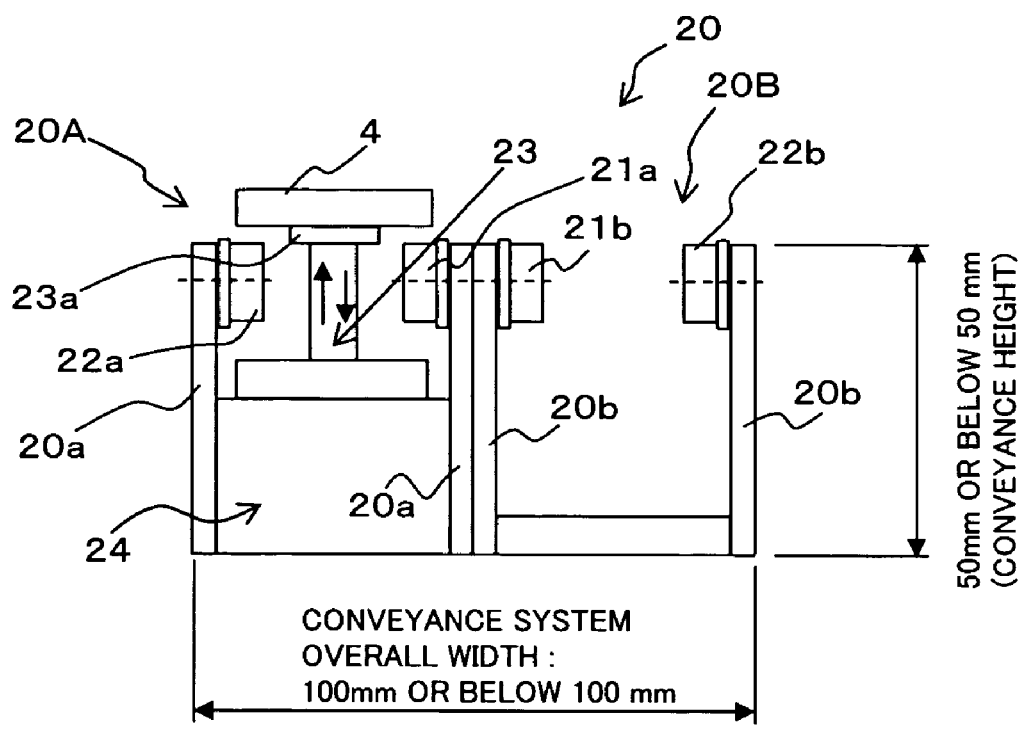
FIG. 12 is an illustration of a portion indicated by an arrow B in FIG. 10.
Figure 13:
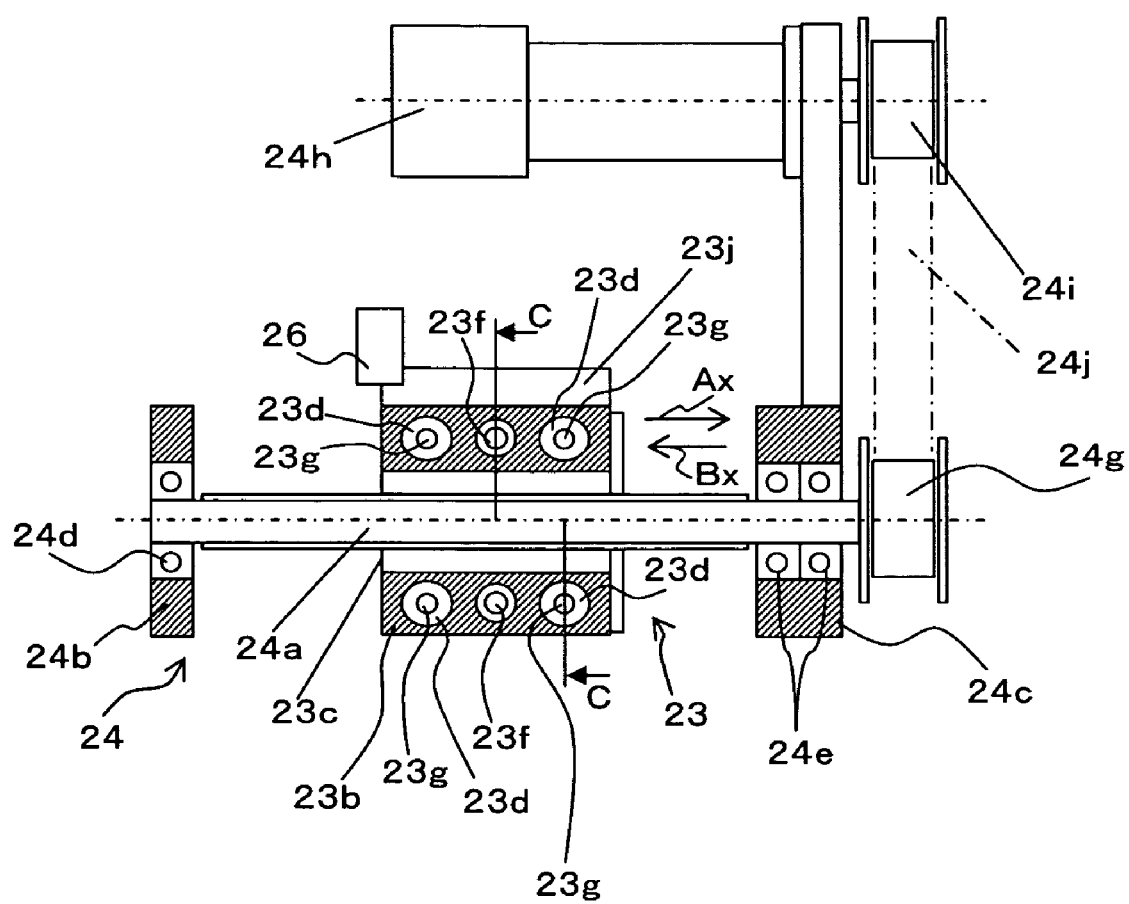
FIGS. 13 and 14 are respectively a horizontal cross-sectional view and a vertical cross-sectional view illustratively showing a pitch feed mechanism and an elevating/lowering mechanism constituting the conveyance positioning mechanism in the base unit according to this embodiment.
Figure 14:
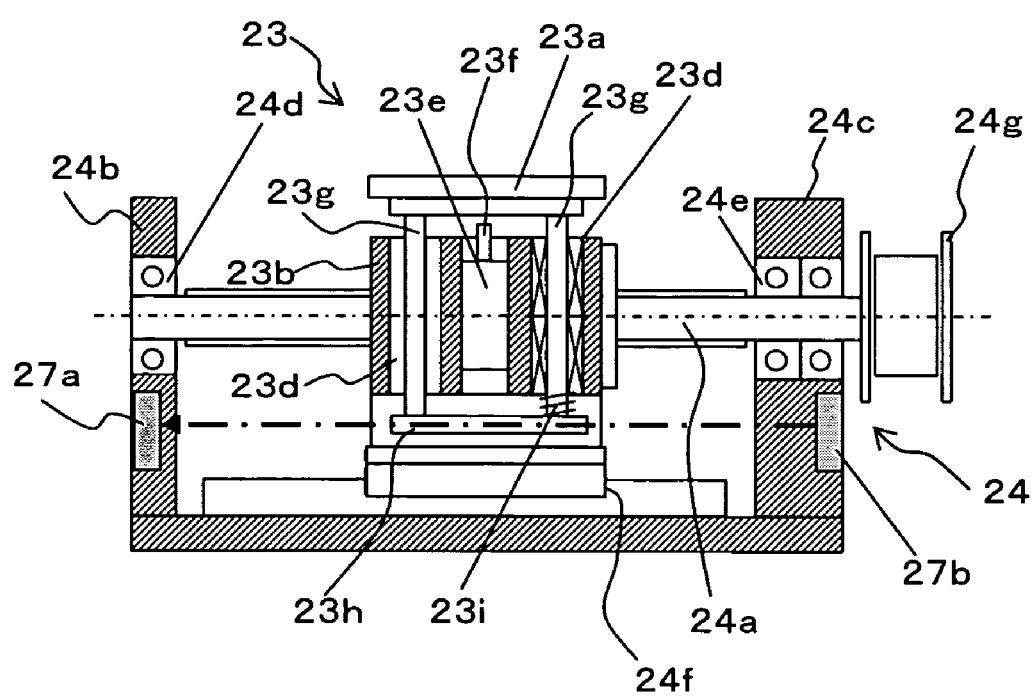
Figure 15:
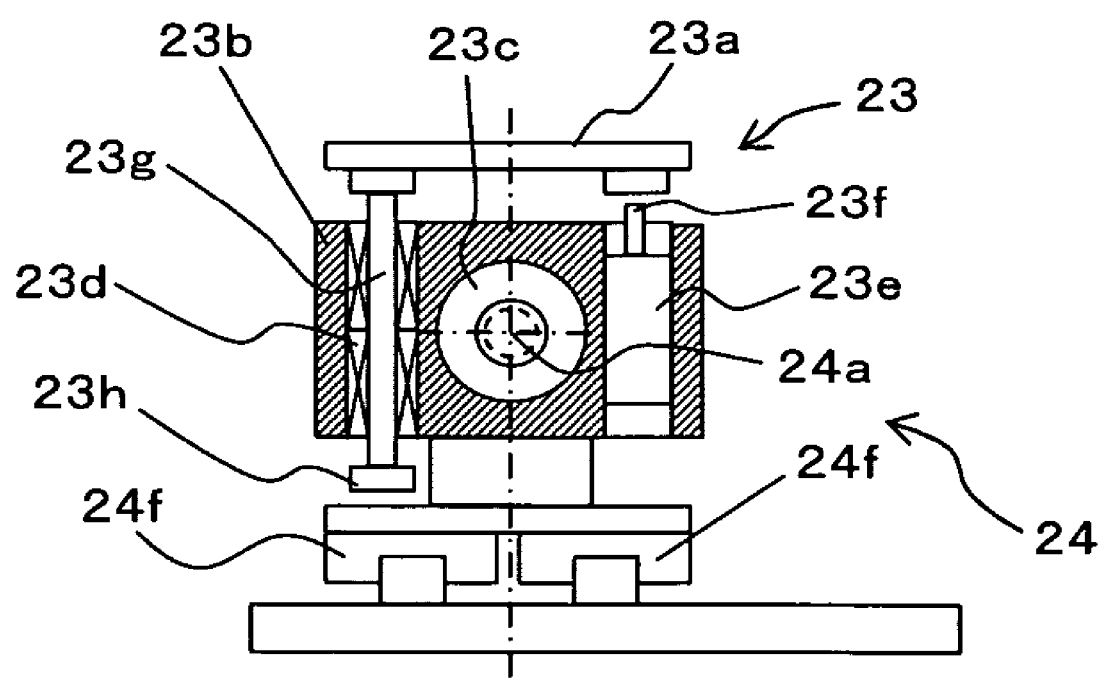
FIG. 15 is an illustrative cross-sectional view taken along a line C—C in FIG. 13.

FIG. 10 is a plan view illustratively showing the conveyance positioning mechanism (pallet feed mechanism) 20A and the pallet return mechanism 20B in the base unit 10 according to this embodiment, FIG. 11 is an illustrative cross-sectional view taken along a line A—A of FIG. 10, FIG. 12 is an illustration of a portion indicted by an arrow B in FIG. 10, FIGS. 13 and 14 are a vertical cross-sectional view and a vertical cross-sectional view illustratively showing a pitch feed mechanism 24 and an elevating/lowering mechanism 23, constituting the conveyance positioning mechanism 20A, in the base unit 10 according to this embodiment, respectively, and FIG. 15 is an illustrative cross-sectional view taken along a line C—C of FIG. 13.

As shown in FIGS. 10 to 12, the conveyance positioning mechanism (pallet feed mechanism) 20A and the pallet return mechanism 20B are disposed in parallel with each other and made to convey pallets 4 in directions indicated by arrows Ax and Bx.

The pallet feed mechanism (conveyance positioning mechanism) 20A, as well as the pallet return mechanism 20B, is constructed in a manner such that drive rollers 21a and driven rollers 22a are rotatably mounted on a pair of frames 20a and 20a disposed in parallel with each other and the elevating/lowering mechanism 23 and the pitch feed mechanism 24 are provided which will be described in detail with reference to FIGS. 13 to 15. Each of the drive rollers 21a is rotationally driven by a drive source (not shown) so that each of pallets 4 is conveyed in the direction indicated by the arrow Ax upon receipt of a driving force from the drive roller 21a in a state where the both-side lower surface portions thereof are supported by the rollers 21a and 22a.

The pallet return mechanism 20B is for returning free pallets 4 as mentioned above, and does not have a positioning mechanism, for that there is no need to stop the pallet 4 for positioning, and it is made with drive rollers 21b and driven rollers 22b being rotationally mounted on a pair of frames 20b and 20b disposed in parallel with each other. Each of the drive rollers 21b is rotationally driven by the same drive source (not shown) as that of the drive roller 21a so that each of free pallets 4 is conveyed in the direction indicated by the arrow Bx upon receipt of a driving force from the drive roller 21b in a state where the both-side lower surface portions thereof are supported by the rollers 21b and 22b.

The plurality of drive rollers 21a and the plurality of drive rollers 21b are rotationally driven by the same drive source as mentioned above. More concretely, forward/reverse alternative right- and left-side worm gears (not shown) are placed on one worm shaft (not shown) to be rotationally driven by this drive source, and the drive rollers 21a and 21b are coupled to the worm gears so that the drive rollers 21a and 21b are rotationally driven simultaneously in opposite directions to each other to accomplish the feed conveyance and return conveyance of the pallets 4 at the same time.

In addition, as shown in FIG. 11, at a rear end portion (left-side end in FIG. 11) of the pallet 4, a stopper 4a is made to protrude downwardly, and on a pallet carry-in side of the pallet feed mechanism 20A, a pallet stopper 25 made to engage with a lower end potion of the stopper 4a of the pallet 4 is formed to protrude upwardly. Moreover, when the pallet 4 is introduced into the pallet feed mechanism 20A, the lower end portion of the stopper 4a of the pallet 4 and an upper end portion of the pallet stopper 25 engage with each other, thereby limiting the conveyance of the pallet 4 in the direction indicated by the arrow Ax (the conveyance by the drive rollers 21a).

Still additionally, the pallet feed mechanism (conveyance positioning mechanism) 20A is equipped with the elevating/lowering mechanism 23 and the pitch feed mechanism 24 which function as the aforesaid conveying mechanism and the aforesaid positioning mechanism in the base unit 10. The elevating/lowering mechanism 23 is made to drive the pallet 4, on which the workpiece 2 is placed, up and down, and the pitch feed mechanism 24 is made to move the elevating/lowering mechanism 23 together with the pallet 4 in the aforesaid predetermined conveying direction (arrow Ax direction), thereby achieving the multi-point positioning.

As shown in FIGS. 11 and 12, the elevating/lowering mechanism 23 is for driving an elevating/lowering stage 23a vertically, and in a state where the elevating/lowering stage 23a is shifted downwardly, the elevating/lowering stage 23a is located so as not to interfere with the pallet 4 conveyed by the rollers 21a and 22a.

On the other hand, in a state where the elevating/lowering stage 23a is shifted upwardly, the elevating/lowering stage 23a presses the pallet 4 downwardly so that the stopper 4a of the pallet 4 and the pallet stopper 25 are released from the engaging state and the pallet 4 is isolated from the drive roller 21a to terminate the transmission of a driving force of the drive roller 21a to the pallet 4.

Thus, when the pitch feed mechanism 24 moves the elevating/lowering mechanism 23 in the arrow Ax direction in a state where the elevating/lowering stage 23a is lifted to push the pallet 4 upwardly, the pallet 4 (or, the workpiece 2 placed on this pallet 4) can be positioned at multiple points in the X-axis direction.

In the conveyance positioning mechanism (pallet feed mechanism) 20A constructed as mentioned above, as shown in FIG. 11, the pallet 4 introduced from the left side in FIG. 11 is moved by the drive rollers 21a to be carried therein so that the stopper 4a of the pallet 4 comes into contact with the pallet stopper 25 and stops thereat. In a state where the pallet 4 is stopped in this way, the elevating/lowering mechanism 23 drives the elevating/lowering stage 23a upwardly from the lowered position so that the pallet 4 is pushed up from its lower surface side by the elevating/lowering stage 23a until the stopper 4a of the pallet 4 is disengaged from the pallet stopper 25.

Moreover, upon receipt of a host command, the pitch feed mechanism 24 moves the elevating/lowering mechanism 23 in the arrow Ax direction to set the pallet 4 (workpiece 2) at a predetermined position in the X-axis direction, where a predetermined process are conducted. After the completion of the predetermined process, the pitch feed mechanism 24 further moves the elevating/lowering mechanism 23 in the arrow Ax direction to shift the pallet 4 up to the rightmost end, and the elevating/lowering mechanism 23 then lowers the pallet 4 so that the pallet 4 is delivered through the drive rollers 21a to the next parts mounting/assembling cell 1. After the delivery of the pallet 4 in this way, in a state where the elevating/lowering stage 23a is lowered, the elevating/ lowering mechanism 23 is again moved up to the leftmost end by means of the pitch feed mechanism 24.

The size of each of the X-axis conveying mechanism 20 shown in FIGS. 10 to 12 is set at, for example, an X-axis direction overall length 100 mm or below 100 mm, a Y-axis direction width (overall width of the conveyance system) 100 mm or below 100 mm, a Z-axis direction height (conveyance height) 50 mm or below 50 mm, and a stroke length of the elevating/lowering mechanism 23 (a ball nut block 23b which will be mentioned later) is set at approximately 50 mm.

Furthermore, with reference to FIGS. 13 to 15, a detailed description will be given hereinbelow of the constructions of the elevating and lowering mechanism 23 and the pitch feed mechanism 24.

As shown in FIGS. 13 to 15, the elevating/lowering mechanism 23 is composed of an elevating/lowering stage 23a, a ball nut block 23b, a ball nut 23c, stroke bearings 23d, an air cylinder 23e, a push rod 23f, rods 23g, a retainer 23h, a retainer pressing string 23i and a mask plate 23j.

The elevating/lowering stage 23a is attached onto upper ends of four rods 23g passing through the ball nut block 23b. These rods 23g are supported by the stroke bearings 23d of the ball nut block 23b to be movable vertically. Onto the lower ends of the rods 23g, there is attached the retainer 23h for restricting the lifted position of the elevating/lowering stage 23a. The retainer pressing spring 23i is interposed between an upper surface of the retainer 23h and a lower surface of the ball nut block 23b, and the elevating/lowering stage 23a is urged downwardly by means of a biasing force of the retainer pressing spring 23i.

In the ball nut block 23b, the ball nut 23c is provided which threadedly engages with a ball screw 24a which will be mentioned later, and the air cylinder 23e is further provided which drives the elevating/lowering stage 23a upwardly and downwardly.

The air cylinder 23e is controlled by the electromagnetic solenoid valve 13 in the base unit 10 (body 10a) to drive the push rod 23f upwardly and downwardly, and when the elevating/lowering stage 23a is lifted, it pushes up the push rod 23f to makes an upper surface of the push rod 23f come into contact with a lower surface of the elevating/lowering stage 23a for pushing up the elevating/lowering stage 23a against the biasing force of the retainer pressing spring 23i. Conversely, in lowering the elevating/lowering stage 23a, the push rod 23f is drawn toward the air cylinder 23e side so that the elevating/lowering stage 23a is downwardly driven by means of the biasing force of the retainer pressing spring 23i.

In addition, the mask plate 23j is also attached onto the ball nut block 23b. This mask plate 23j is used for carrying out the origin alignment on the pitch feed mechanism 24 at the startup of the parts mounting/assembling cell 1, and the mask plate 23j and an origin sensor 26 fitted to a fixing portion of the pitch feed mechanism 24 cooperate with each other to carry out the origin alignment on the pitch feed mechanism 24. In FIG. 15, the mask plate 23j is omitted from the illustration.

On the other hand, the pitch feed mechanism 24 is composed of, in addition to the above-mentioned ball nut block 23b and ball nut 23c, a ball screw 24a, end plates 24b, 24c, bearings 24d, 24e, direct-acting guides 24f, a ball screw pulley 24g, an AC servo motor 24h, a motor pulley 24i and a timing belt 24j.

The ball screw 24a is disposed along the X-axis direction, and both ends thereof are pivotally supported through bearings 24d and 24e on the end plates 24b and 24c. This ball screw 24a is threadedly coupled to the ball nut 23c of the ball nut block 23b and, when it is rotated, the ball nut block 23b (that is, the entire elevating and lowering mechanism 23) is shifted in the X-axis direction. This shifting direction is switched between the arrow Ax direction and the arrow Bx direction in response to the switching of the rotating direction of the ball screw 24a.

In addition, for moving the ball nut block 23b linearly in the X-axis direction without rotating, a pair of right and left direct-acting guides (LM guides) 24f and 24f are provided between a lower portion of the ball nut block 23b and a fixed side of the pitch feed mechanism 24. Owing to these direct-acting guides 24f and 24f, the ball nut block 23b is linearly guided in the X-axis direction without rotating.

Still additionally, the ball screw pulley 24g is coaxially fitted to one end side (the right end side in FIGS. 13 and 14) of the ball screw 24a, and the motor pulley 24i is coaxially fitted to a rotating drive shaft of the AC servo motor 24h located in parallel with the ball screw 24a. Yet additionally, the timing belt 24j is wound between the ball screw pulley 24g and the motor pulley 24i, and the rotating drive force of the AC servo motor 24h is transmitted through the motor pulley motor 24i, the timing belt 24j and the ball screw pulley 24g to the ball screw 24a so that the ball screw 24a is rotationally driven in a predetermined direction.

Yet additionally, a pair of transmission type sensors 27a and 27b are fitted to the end plates 24b and 24c, and these transmission type sensors 27a and 27b detect the vertical position of the retainer 23h to detect a lifted or lowered position of the elevating/lowering stage 23a.

In the elevating/lowering mechanism 23 thus constructed, the air cylinder 23e and the stroke bearing 23d are integrated with the ball nut 23b and the functions for the elevating/lowering drive are collected in the ball nut block 23b, which contributes greatly to the size reduction of the elevating/lowering mechanism 23, thus leading to the size reduction of the pitch feed mechanism and the X-axis conveying mechanism 20.

Moreover, in the pitch feed mechanism 24 thus constructed, the AC servo motor 24h is rotated in accordance with an instruction value from a host and the rotational drive force of the AC servo motor 24h is transmitted through a transmission/reduction mechanism, comprising the motor pulley 24i, the timing belt 24j and the ball screw pulley 24g, to the ball screw 24a, and the ball nut 23b is moved linearly along the direct-acting guides 24f in accordance with the rotation and rotating direction of the ball screw 24a to be put (positioned) at a predetermined position in the X-axis direction. Still moreover, the elevating and lowering stage 23a is lifted through the pushing operation of the push rod 23f of the air cylinder 23e and is lowered by means of a the biasing force of the retainer pressing spring 23i.

The employment of these elevating/lowering mechanism 23 and pitch feed mechanism 24 enables the size reduction of the X-axis conveying mechanism 20, which leads to the size reduction of the base unit 10 and the parts mounting/assembling cell 1, and further enables upgrading the speed of the operation of the X-axis conveying mechanism.

[1-8] Parts Supply Unit

Figure 16:
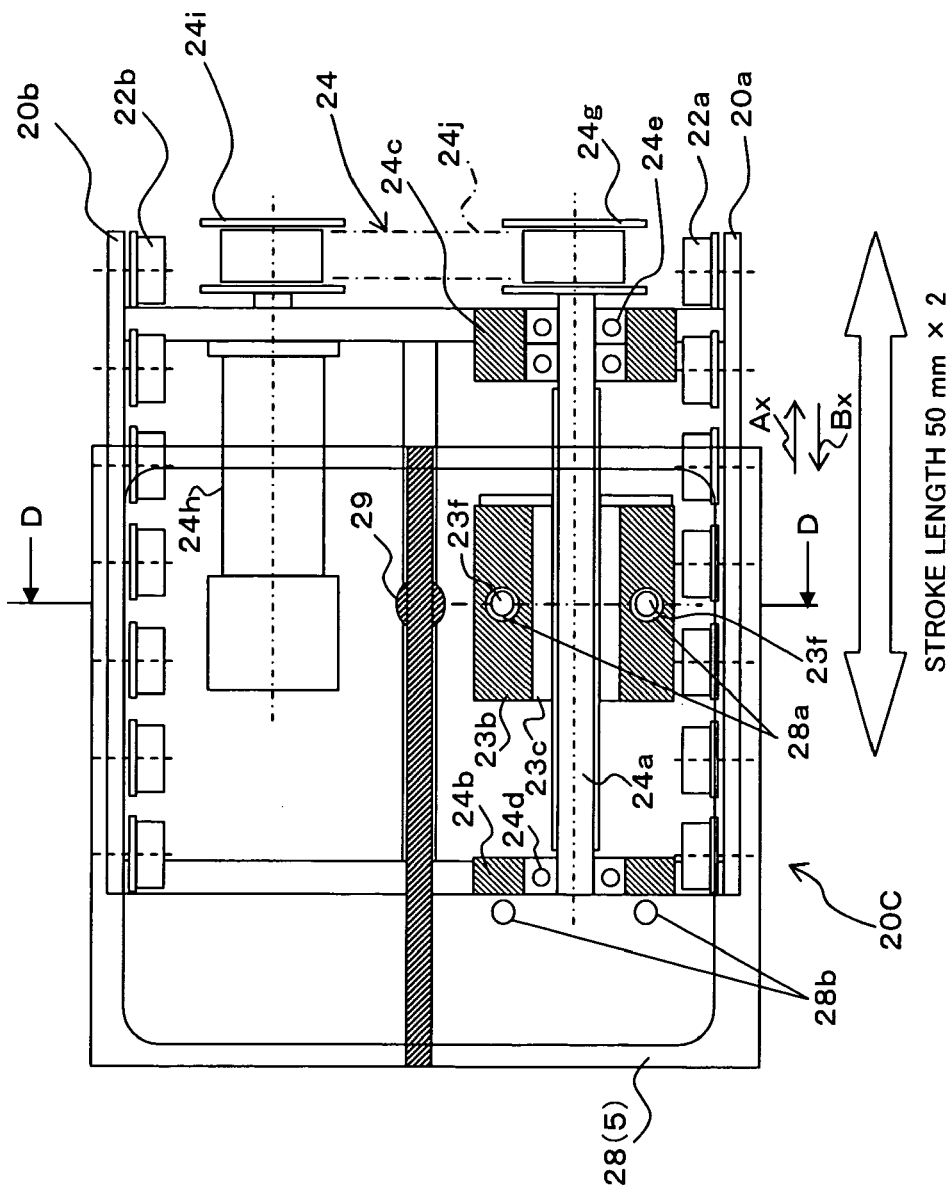
FIG. 16 is a plan view illustratively showing a parts supply unit, partially broken, constructed by diverting components of an X-axis conveying mechanism including the pitch feed mechanism and the elevating/lowering mechanism shown in FIGS. 13 to 15.
Figure 17:
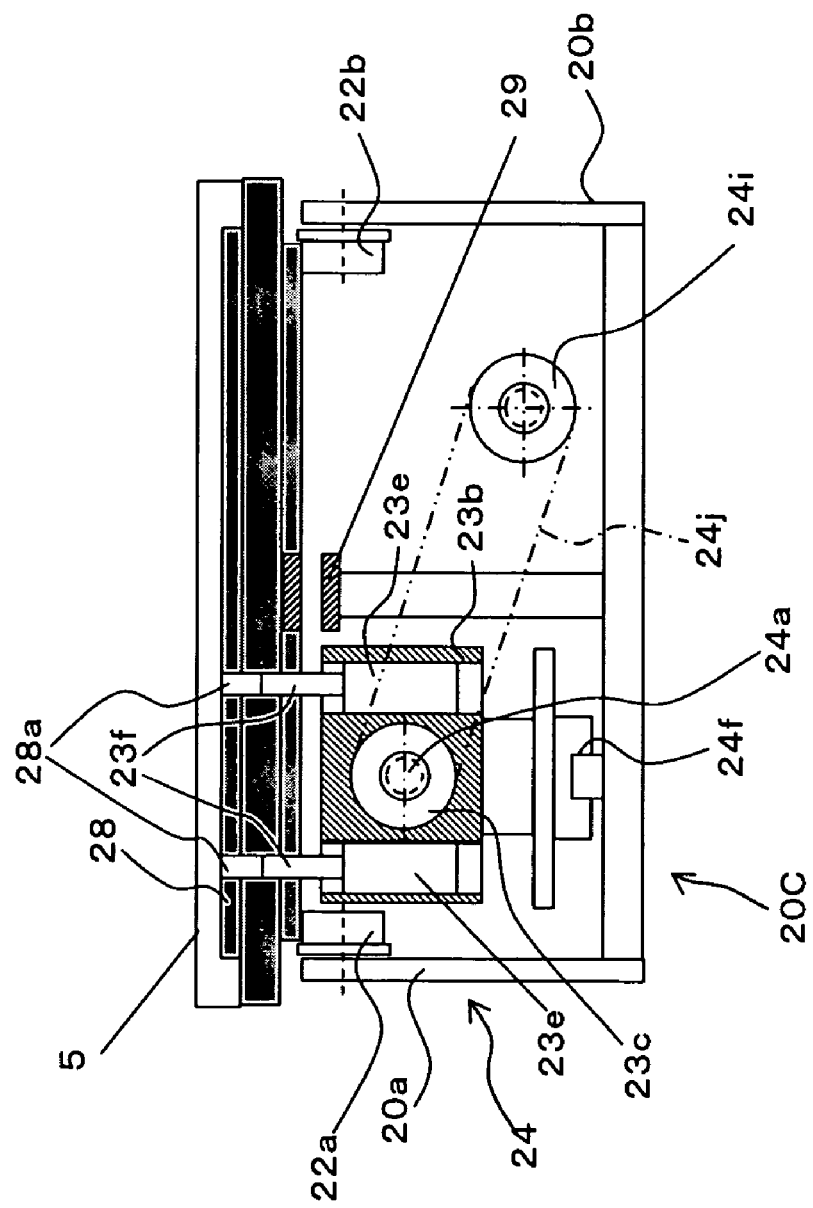
FIG. 17 is an illustrative cross-sectional view taken along a line D—D in FIG. 16.

Referring to FIGS. 16 and 17, a description will be given hereinbelow of a parts supply unit 20C constructed by diverting the components of the X-axis conveying mechanism including the pitch feed mechanism 24 and the elevating/lowering mechanism 23 shown in FIGS. 10 to 15. FIG. 16 is a partially broken plan view illustratively showing the parts supply unit 20C and FIG. 17 is an illustrative cross-sectional view taken along a line D—D of FIG. 16. FIG. 16 is an illustration in a state of the see-through of a parts supply tray 5 and a table 28.

The parts supply unit 20C shown in FIGS. 16 and 17 includes a table 28 carrying a parts supply tray 5, for example, having a width of 4 inches, for conveying the parts supply tray 5 in the X-axis direction (the arrow Ax direction or the arrow Bx direction), and is constructed by diverting the frames 20a, 20b, the driven rollers 22a, 22b, the ball nut block 23b, the ball nut 23c, the air cylinder 23e, the push rod 23f, the ball screw 24a, the end plates 24b, 24c, the bearings 24d, 24e, the direct-acting guides 24f, the ball screw pulley 24g, the AC servo motor 24h, the motor pulley 24i and the timing belt 24j, which are the components of the X-axis conveying mechanism 20 including the pitch feed mechanism 24 and the elevating/lowering mechanism 23 shown in FIGS. 10 to 15.

However, in the parts supply unit 20C, the frames 21a, 21b and the drive rollers 21a, 21b, located at a central portion of the X-axis conveying mechanism 20, are omitted, and in the ball nut block 23b, the through-hole for the rod 23g and the stroke bearing 23d are omitted. Moreover, as shown in FIG. 17, in the parts supply unit 20C, the direct-acting guide 24f is only one in number.

In addition, in the table 28, a pair of right and left push rod insertion holes 28a, 28a and a pair of right and left push rod insertion holes 28b, 28b are made at an appropriate interval in the X-axis direction. When a pair of right and left air cylinders 23e and 23e placed in the ball nut block 23b have lifted the push rods 23f and 23f, the tip portions of these push rods 23f and 23f are simultaneously inserted into the push rod insertion holes 28a and 28a, respectively. Likewise, when the pair of right and left air cylinders 23e and 23e have lifted the push rods 23f and 23f, the tip portions of these push rods 23f and 23f are simultaneously inserted into the push rod insertion holes 28b and 28b, respectively.

Still additionally, in a state where the push rods 23f and 23f are inserted into the push rod insertion holes 28a, 28a or 28b, 28b, when the ball nut block 23b is shifted in the X-axis direction (the arrow Ax direction or the arrow Bx direction) by means of the function of the pitch feed mechanism 24, the table 28 is conveyed in the X-axis direction (the arrow Ax direction or the arrow Bx direction) in a state where the both-side lower surface portions thereof are supported by the driven rollers 22a and 22b, respectively.

Yet additionally, below the table 28 and at a central portion of the parts supply unit 20C, a table holding magnet 29 is placed in opposed relation to a lower surface of the table 28 and spaced by a predetermined distance with respect thereto for attracting the table 28 at all times.

The parts supply unit 20C thus constructed basically operates as follows. That is, when the table 28 carrying the parts supply tray 5 is introduced into the parts supply unit 20C, the ball nut block 23b is shifted to a position corresponding to the push rod insertion holes 28a, 28a and the push rods 23f, 23f of the air cylinders 23e, 23e are then lifted so that the tip portions of these push rods 23f, 23f are inserted into (connected to) the push rod insertion holes 28a, 28a. Following this, through the use of the function of the pitch feed mechanism 24, the ball nut block 23b is moved in a state supported/guided by the driven rollers 22a and 22b, thereby placing and fixing the parts supply tray 5 at an arbitrary position.

At this time, when the ball nut block 23b arrives at the rightmost end, the push rods 23f, 23f are pulled down to be temporarily released from the connection with the table 28. Moreover, the ball nut block 23b is again shifted to the left end side to be located at a position corresponding to the push rod insertion holes 28b, 28b, and the tip portions of the push rods 23f, 23f are then inserted into (connected to) the push rod insertion holes 28b, 28b and the table 28 is moved in like manner.

Thus, through this two-stage operation, the conveyance/positioning of the parts supply tray 5 becomes feasible in a range (in this case, for example, twice the stroke length of 50 mm) above the stroke length of the ball nut block 23b. Therefore, the size reduction of the parts supply unit 20C is realizable and the movement/positioning of the parts supply tray 5 having a size larger than that of the parts supply unit 20C is realizable.

In addition, in the parts supply unit 20C according to this embodiment, since the table 28 is attracted downwardly by the table holding magnet 29 at all times, the parts supply tray 5 (table 28) is surely preventable from being inclined due to the overhang.

[1-9] First to Third Construction Examples of Parts Mounting/Assembling Cell

Furthermore, referring to FIGS. 18 to 20, a description will be given hereinbelow of the first to third construction examples (first to third modifications of the placing cell) of the parts mounting/assembling cell using the parts supply unit 20C shown in FIGS. 16 and 17.

[1-9-1] First Construction Example of Parts Mounting/Assembling Cell (First Modification of the Placing Cell)

Figure 18:
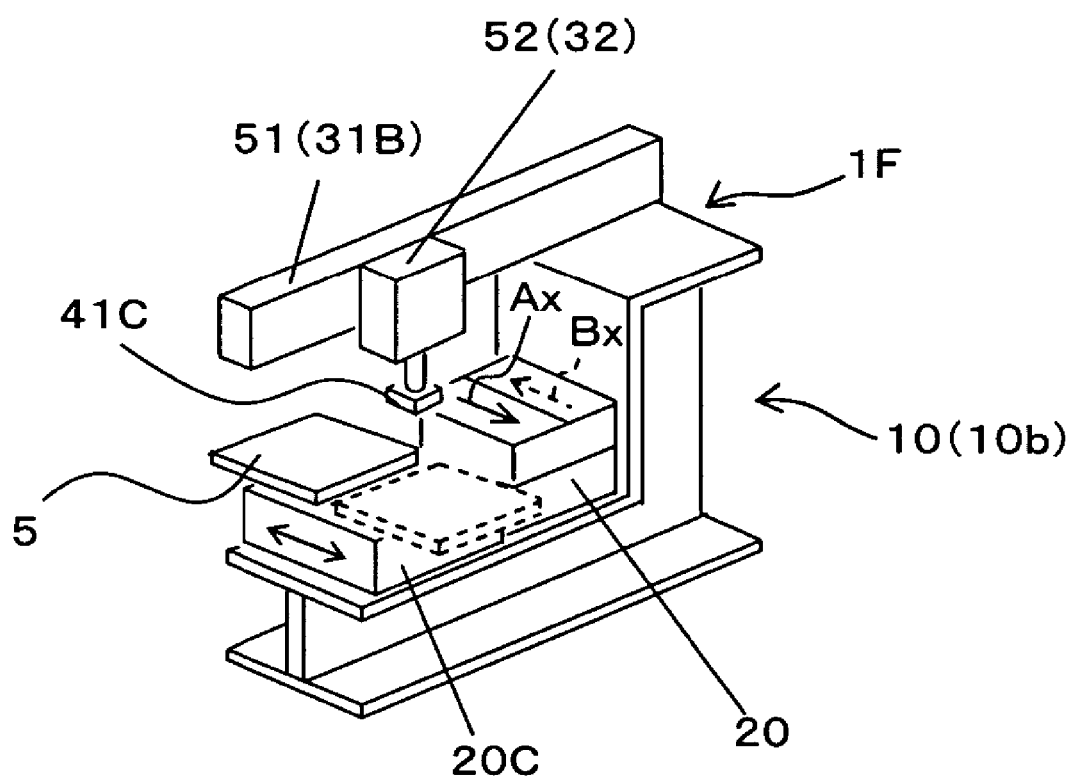
FIG. 18 is a perspective view illustratively showing a first construction example (first modification of a placing cell) of a parts mounting and assembling apparatus using the parts supply unit shown in FIGS. 16 and 17.

FIG. 18 is a perspective view illustratively showing the first construction example (first modification of the placing cell) of the parts mounting/assembling cell using the aforesaid parts supply unit 20C. As well as the mounting cell 1C shown in FIGS. 1 to 3, a placing cell (parts mounting/assembling cell) 1F shown in FIG. 18 is constructed in a manner such that, in the base unit 10, there are provided a base Y-axis moving mechanism 51 (Y-axis multi-point positioning mechanism 31B), a base pickup 52 (Z-axis two-point positioning mechanism 32) and a part suction hand 41C. In this placing cell 1F, the aforesaid parts supply unit 20C is used in place of the aligner mechanism 33 of the placing cell 1C.

In the placing cell 1F thus constructed, parts (not shown in FIG. 18) on the parts supply tray 5 placed on the parts supply unit 20C are sucked by the part suction hand 41C existing at the tip portion of the base pickup 52 and, after shifted to an assembling area on the X-axis conveying mechanism 20 by means of the base Y-axis moving mechanism 51, they are placed/mounted in a workpiece (not shown in FIG. 18) on a pallet conveyed/positioned in advance. This placing cell 1F may be used in a case in which a high mounting accuracy is not required particularly with respect to a workpiece.

[1-9-2] Second Construction Example of Parts Mounting/Assembling Cell (Second Modification of the Placing Cell)

Figure 19:
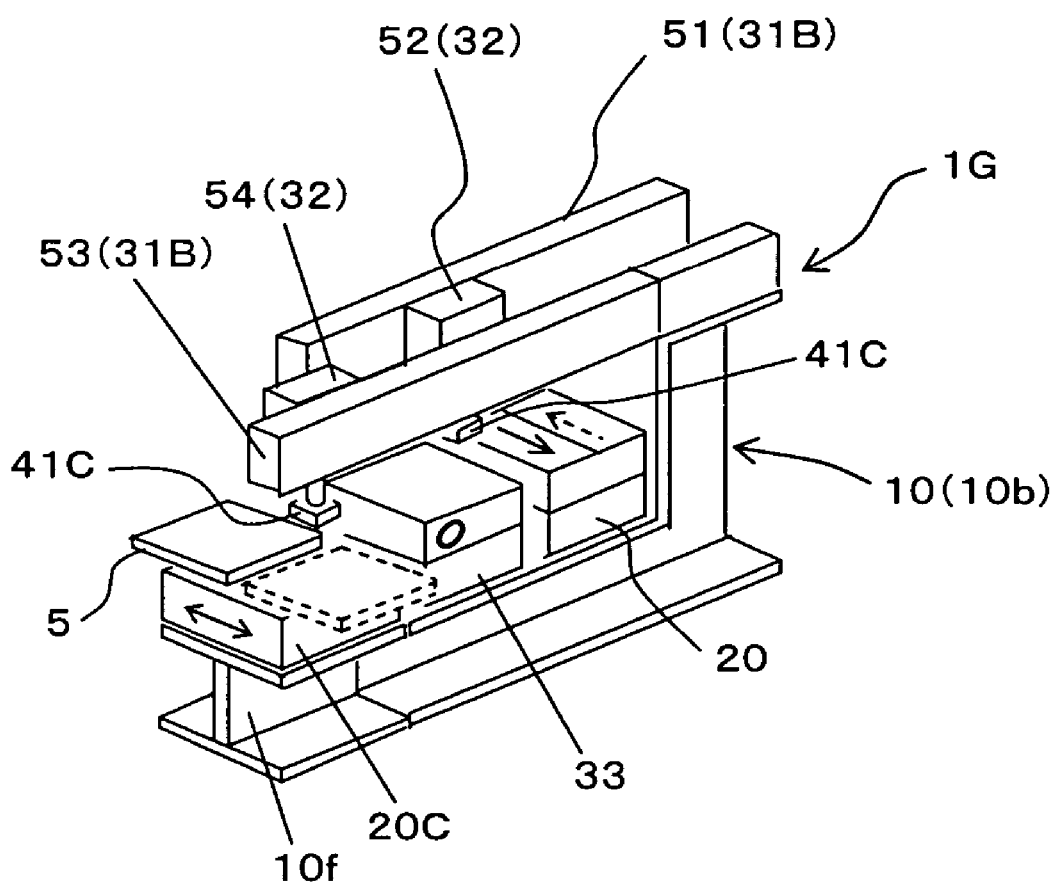
FIG. 19 is a perspective view illustratively showing a second construction example (second modification of a placing cell) of a parts mounting and assembling apparatus using the parts supply unit shown in FIGS. 16 and 17.

FIG. 19 is a perspective view illustratively showing the second construction example (second modification of the placing cell) of the parts mounting/assembling cell using the aforesaid parts supply unit 20C. As well as the placing cell 1C shown in FIGS. 1 to 3, a placing cell (parts mounting/assembling cell) 1G shown in FIG. 19 is constructed in a manner such that, in the base unit 10, there are provided a base Y-axis moving mechanism 51 (Y-axis multi-point positioning mechanism 31B), a base pickup 52 (Z-axis two-point positioning mechanism 32), a part suction hand 41C, and an aligner mechanism 33. Further provided are a supply Y-axis moving mechanism 53 having a construction similar to that of the Y-axis multi-point positioning mechanism 31B and a supply pickup 54 having a construction similar to that of the Z-axis two-point positioning mechanism 32. The supply pickup 54 is also equipped with a part suction hand 41. Moreover, a frame extension 10f is coupled to the fundamental frame 10b of the mounting cell 1G, and the aforesaid parts supply unit 20C is provided in this frame extension 10f.

In this placing cell 1G thus constructed, parts (not shown in FIG. 19) on the parts supply tray 5 placed on the parts supply unit 20C are sucked by the part suction hand 41C existing at the tip portion of the supply pickup 54 and roughly supplied above the aligner mechanism 33 so that the posture of the parts is corrected by the aligner mechanism 33. Following this, the posture corrected parts are sucked by the part suction hand 41C existing at the tip portion of the base pickup 52 and shifted to an assembling area on the X-axis conveying mechanism 20 by means of the base Y-axis moving mechanism 51, and they are placed/mounted in a workpiece (not shown in FIG. 19) on a pallet conveyed/positioned in advance. This placing cell 1G may be used in a case in which a high packaging accuracy is required with respect to a workpiece.

[1-9-3] Third Construction Example of Parts Mounting/Assembling Cell (Third Modification of the Placing Cell)

Figure 20:
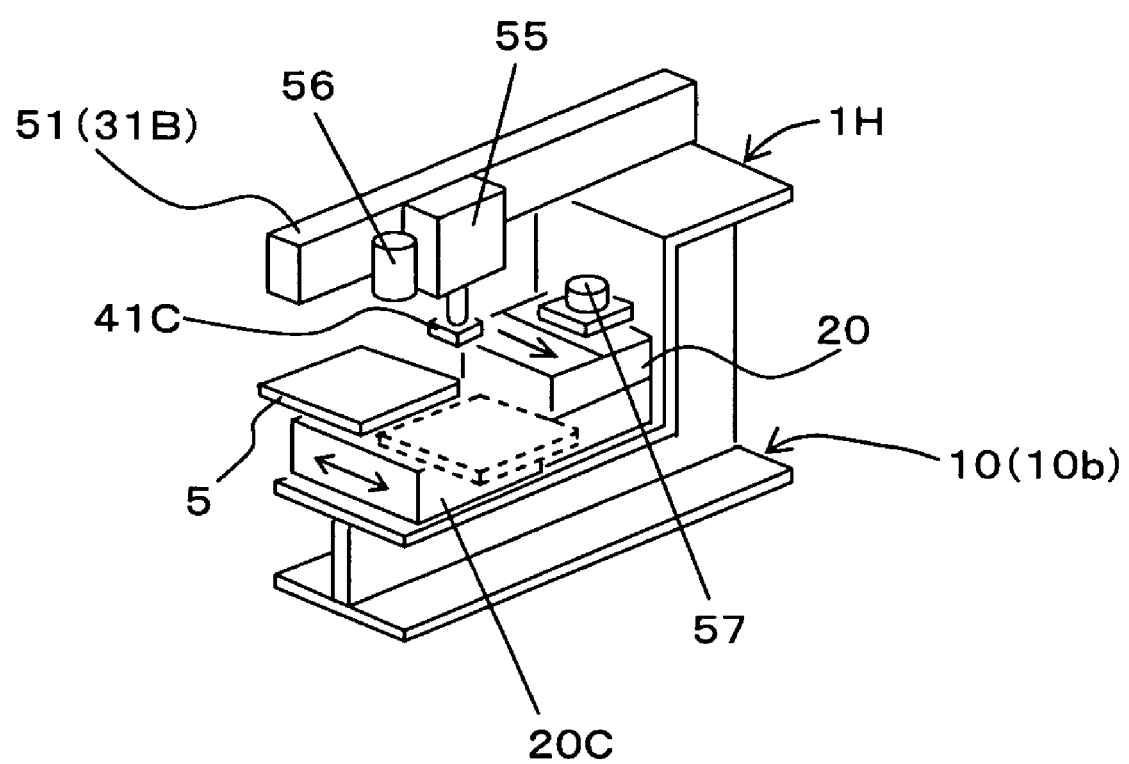
FIG. 20 is a perspective view illustratively showing a third construction example (third modification of a placing cell) of a parts mounting and assembling apparatus using the parts supply unit shown in FIGS. 16 and 17.

FIG. 20 is a perspective view illustratively showing the third construction example (third modification of the mounting cell) of the parts mounting/assembling cell using the aforesaid parts supply unit 20C. As well as the mounting cell 1F shown in FIG. 18, a placing cell (parts mounting/assembling cell) 1H shown in FIG. 20 is constructed in a manner such that, in the base unit 10, there are provided a base Y-axis moving mechanism 51 (Y-axis multi-point positioning mechanism 31B), a part suction hand 41C and the aforesaid parts supply unit 20C. In this placing cell 1H, a base pickup (Y-axis multi-point positioning/Xyθ axis adjusting mechanism) 55 capable of performing multi-point positioning in the Y-axis direction and of adjusting the Xyθ axis is used in place of the base pickup 52 of the placing cell 1F, and the part suction hand 41C is attached to the tip portion of the base pickup 55. Moreover, in the base pickup 55, a work camera 56 is additionally provided to pick up an image of a workpiece (not shown in FIG. 20) to recognize the posture of the workpiece, and in the base unit 10 (fundamental frame 10b, a part camera 57 is provided to pick up an image of a part (not shown in FIG. 20) to recognize the posture of the part.

In this placing cell 1H thus constructed, parts on the parts supply tray 5 placed on the parts supply unit 20C are sucked by the part suction hand 41C existing at the tip portion of the base pickup 55 and, after shifted to an assembling area on the X-axis conveying mechanism 20 by means of the base Y-axis moving mechanism 51, they are packaged in a workpiece on a pallet conveyed/positioned in advance. At this time, in this placing cell 1H, the part camera 57 recognizes the part posture and, at the same time, the work camera 56 recognizes the work posture so that, on the basis of the recognition results, the deviation of the posture of the part sucked by the part suction hand 41C is corrected through the use of the Xyθ axis adjusting function of the base pickup 55 and the part is placed/mounted in the workpiece. This placing cell 1H may be used in a case in which a very high mounting accuracy is required with respect to a workpiece.

[2] Others

It should be understood that the present invention is not limited to the above-described embodiment, and that it is intended to cover all changes and modifications of the embodiment of the invention herein which do not constitute departures from the spirit and scope of the invention.

For example, as in the case of the above-described embodiment, the present invention is applicable not only to micro sensor devices such as MEMS gyro sensors but also to cases of mounting/assembling various types of small-sized parts, and the effects similar to those of the above-described embodiments are obtainable.

What is claimed is:

1. A parts mounting and assembling apparatus comprising:
    a base unit including:
    a body containing a device to be used in common among a plurality of processes for mounting and assembling parts;
    a conveying mechanism for conveying a workpiece, which is an object of mounting and assembling, on said body in a predetermined conveying direction along a manufacturing line; and
    a positioning mechanism for placing said workpiece at a predetermined position in said predetermined conveying direction;
    a dedicated unit including an end effector for conducting processing on said workpiece or a part to be mounted on said workpiece, according to each of said processes; and
    a selected mechanism unit including a moving mechanism for moving said end effector in two axial directions perpendicular to said predetermined conveying direction in each of said processes to adjust a relative position between said end effector and said workpiece or said part for positioning,
    said moving mechanism being selected from a plurality of types according to requirements of each of said processes to be interchangeably attached as said selected mechanism unit with respect to said base unit, and
    said end effector being selected from a plurality of types according to requirements of each of said processes to be interchangeably attached as said dedicated unit with respect to said moving mechanism.

2. A parts mounting and assembling apparatus according to claim 1, wherein said selected mechanism unit further includes an aligner mechanism for adjusting a horizontal position of said workpiece or part to be introduced into said manufacturing line by said end effector or adjusting a horizontal position of said workpiece taken out from said manufacturing line by said end effector, with said aligner mechanism being selected from a plurality of types according to requirements of each of said processes to be interchangeably attached as said selected mechanism unit with respect to said base unit, and
    said dedicated unit further includes a fixing mechanism for fixing said workpiece or said part at a predetermined position on said aligner mechanism, with said fixing mechanism being selected from a plurality of types according to requirements of each of said processes to be interchangeably attached as said dedicated unit with respect to said aligner mechanism.

3. A parts mounting and assembling apparatus according to claim 2, wherein said parts mounting and assembling apparatus is made to be connectable to parts mounting and assembling apparatuses for other processes in said predetermined conveying direction and, at the connection with other-process parts mounting and assembling apparatuses, said conveying mechanism is made to deliver said workpiece to a conveying mechanism of the other-process parts mounting and assembling apparatus adjacent to said parts mounting and assembling apparatus.

4. A parts mounting and assembling apparatus according to claim 3, wherein, as said conveying mechanism, two conveying mechanisms are disposed in parallel with each other in the form of two lines on said base unit, one conveying mechanism is made to convey a pallet, on which said workpiece is placed, to said other-process parts mounting and assembling apparatus adjacent thereto in said predetermined conveying direction, and the other conveying mechanism is made to convey only said pallet to said other-process parts mounting and assembling apparatus adjacent thereto in a direction opposite to said predetermined conveying direction.

5. A parts mounting and assembling apparatus according to claim 1, wherein said parts mounting and assembling apparatus is made to be connectable to parts mounting and assembling apparatuses for other processes in said predetermined conveying direction and, at the connection with other-process parts mounting and assembling apparatuses, said conveying mechanism is made to deliver said workpiece to a conveying mechanism of the other-process parts mounting and assembling apparatus adjacent to said parts mounting and assembling apparatus.

6. A parts mounting and assembling apparatus according to claim 5, wherein, as said conveying mechanism, two conveying mechanisms are disposed in parallel with each other in the form of two lines on said base unit, one conveying mechanism is made to convey a pallet, on which said workpiece is placed, to said other-process parts mounting and assembling apparatus adjacent thereto in said predetermined conveying direction, and the other conveying mechanism is made to convey only said pallet to said other-process parts mounting and assembling apparatus adjacent thereto in a direction opposite to said predetermined conveying direction.

7. A parts mounting and assembling apparatus according to claim 1, wherein said body of said base unit contains, as said device, a control unit for controlling operations of said conveying mechanism, said positioning mechanism, said moving mechanism and said end effector.

8. A parts mounting and assembling apparatus according to claim 1, wherein said body of said base unit contains, as said device, an input/output unit functioning as an input/output interface for interchanging a signal with respect to an external controller or a control unit of a parts mounting and assembling apparatus for other process.

9. A parts mounting and assembling apparatus according to claim 1, wherein said body of said base unit is constructed by disposing a fundamental frame having an H-shaped cross section along an axis of said body.

10. A parts mounting and assembling apparatus according to claim 9, wherein said fundamental frame constituting said body of said base unit is made to be connectable to a frame extension having an H-shaped cross section for extending said base unit.

11. A parts mounting and assembling apparatus according to claim 10, wherein said fundamental frame of said base unit is arranged and fixed on a ladder-type line chassis, and said frame extension of said base unit is arranged and fixed on a chassis extension connected to said ladder-type line chassis.

12. A parts mounting and assembling apparatus according to claim 11, wherein dovetail grooves are made in said ladder-type line chassis and said chassis extension, movable nuts are placed in said dovetail grooves to slide along said dovetail grooves, and said fundamental frame and said frame extension are fixed onto said ladder-type line chassis and said chassis extension through the use of said movable nuts, respectively.

13. A parts mounting and assembling apparatus according to claim 11, wherein said fundamental frame and said frame extension of said base unit are arranged through movable guides onto said ladder-type line chassis and said chassis extension, respectively, and said base unit, together with said selected mechanism unit and said dedicated unit, is made to be drawn out in a horizontal direction perpendicular to said predetermined conveying direction from said ladder-type line chassis and said chassis extension.

14. A parts mounting and assembling apparatus according to claim 9, wherein said fundamental frame of said base unit is arranged and fixed on a ladder-type line chassis.

15. A parts mounting and assembling apparatus according to claim 14, wherein a dovetail groove is made in said ladder-type line chassis, a movable nut is placed in said dovetail groove to slide along said dovetail groove, and said fundamental frame is fixed onto said ladder-type line chassis through the use of said movable nut.

16. A parts mounting and assembling apparatus according to claim 14, wherein said fundamental frame of said base unit is arranged through a movable guide onto said ladder-type line chassis, and said base unit, together with said selected mechanism unit and said dedicated unit, is made to be drawn out in a horizontal direction perpendicular to said predetermined conveying direction from said ladder-type line chassis.

17. A parts mounting and assembling apparatus according to claim 1, wherein said conveying mechanism and said positioning mechanism in said base unit are integrated with each other.

18. A parts mounting and assembling apparatus according to claim 17, wherein said conveying mechanism and said positioning mechanism comprise an elevating/lowering mechanism for moving a pallet, on which said workpiece is placed, upwardly and downwardly and a pitch feed mechanism for moving said elevating/lowering mechanism together with said pallet in said predetermined conveying direction for positioning.

19. A parts mounting and assembling apparatus according to claim 18, further comprising a parts supply unit for moving a table, on which a parts supply tray is arranged, in said predetermined conveying direction or a direction opposite to said predetermined conveying direction, by diverting components of said elevating/lowering mechanism and said pitch feed mechanism functioning as said conveying mechanism and said positioning mechanism in said base unit.

* * * * *